（12）United States Patent
Lee

(10) Patent No.: US 12,238,927 B2
(45) Date of Patent: Feb. 25, 2025

(54) SEMICONDUCTOR MEMORY DEVICE AND MANUFACTURING METHOD THEREOF

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 221 days.

(21) Appl. No.: 17/859,274

(22) Filed: Jul. 7, 2022

(65) Prior Publication Data

US 2022/0344363 A1 Oct. 27, 2022

Related U.S. Application Data

(62) Division of application No. 16/811,739, filed on Mar. 6, 2020, now Pat. No. 11,417,672.

(30) Foreign Application Priority Data

Aug. 22, 2019 (KR) .................. 10-2019-0103297

(51) Int. Cl.
| | |
|---|---|
| *H01L 21/00* | (2006.01) |
| *H10B 12/00* | (2023.01) |
| *H10B 41/27* | (2023.01) |
| *H10B 10/00* | (2023.01) |

(52) U.S. Cl.
CPC ......... *H10B 41/27* (2023.02); *H10B 12/0335* (2023.02); *H10B 10/18* (2023.02)

(58) Field of Classification Search
CPC ..... H10B 41/27; H10B 12/0335; H10B 10/18
See application file for complete search history.

(56) References Cited

U.S. PATENT DOCUMENTS

| | | | |
|---|---|---|---|
| 10,510,738 | B2 | 12/2019 | Kim et al. |
| 11,024,636 | B1 | 6/2021 | Leobandung |
| 11,158,622 | B1 | 10/2021 | Zhang |
| 11,380,668 | B2 | 7/2022 | Lee |
| 2013/0264626 | A1 | 10/2013 | Sawa |

(Continued)

FOREIGN PATENT DOCUMENTS

| | | |
|---|---|---|
| CN | 107393583 A | 11/2017 |
| CN | 108063142 A | 5/2018 |

(Continued)

*Primary Examiner* — Richard A Booth

(74) *Attorney, Agent, or Firm* — WILLIAM PARK & ASSOCIATES LTD.

(57) ABSTRACT

There are provided a semiconductor memory device and a manufacturing method thereof. The manufacturing method of the semiconductor memory device includes: forming a preliminary memory cell array that includes a gate stack structure and a channel structure wherein the gate stack structure includes interlayer insulating layers and conductive patterns, alternately stacked on a first substrate, and wherein the channel structure has a first end portion that penetrates the gate stack structure and extends into the first substrate; forming a common source line to be in contact with a second end portion of the channel structure, the common source line formed on a first surface of the gate stack structure; removing the first substrate; and forming a bit line connected to the first end portion of the channel structure on a second surface of the gate stack structure that is opposite of the first surface of the gate stack structure.

9 Claims, 21 Drawing Sheets

(56) References Cited

U.S. PATENT DOCUMENTS

| | | |
|---|---|---|
| 2014/0061776 A1 | 3/2014 | Kwon et al. |
| 2015/0318301 A1 | 11/2015 | Lee et al. |
| 2016/0141419 A1* | 5/2016 | Baenninger ............ H10B 41/20 |
| | | 257/314 |
| 2016/0293625 A1 | 10/2016 | Kang et al. |
| 2017/0330624 A1* | 11/2017 | Lim ....................... H10B 43/30 |
| 2018/0366488 A1 | 12/2018 | Choi et al. |
| 2019/0043868 A1 | 2/2019 | Hasnat et al. |
| 2019/0081065 A1 | 3/2019 | Lee |
| 2019/0164983 A1 | 5/2019 | Hu et al. |
| 2020/0135751 A1 | 4/2020 | Liu et al. |
| 2020/0235028 A1 | 7/2020 | Lee et al. |
| 2021/0035966 A1 | 2/2021 | Tsai et al. |
| 2021/0057020 A1 | 2/2021 | Tanaka |
| 2021/0090983 A1 | 3/2021 | Lin et al. |
| 2021/0151462 A1 | 5/2021 | Baek |
| 2021/0193790 A1 | 6/2021 | Hu et al. |
| 2021/0210505 A1 | 7/2021 | Choi et al. |
| 2021/0320079 A1 | 10/2021 | Baek |
| 2021/0320118 A1 | 10/2021 | Zhang et al. |
| 2021/0327892 A1* | 10/2021 | Jung ..................... H10B 43/10 |
| 2021/0375900 A1 | 12/2021 | Zhang et al. |
| 2022/0246631 A1 | 8/2022 | Akutsu et al. |
| 2022/0302099 A1 | 9/2022 | Lee |
| 2022/0344363 A1 | 10/2022 | Lee |
| 2023/0050150 A1 | 2/2023 | Morein et al. |

FOREIGN PATENT DOCUMENTS

| | | |
|---|---|---|
| CN | 108242444 A | 7/2018 |
| CN | 109273453 A | 1/2019 |
| CN | 109509756 A | 3/2019 |
| CN | 109671711 A | 4/2019 |
| CN | 109686739 A | 4/2019 |
| KR | 1020110128717 A | 11/2011 |
| KR | 1020140076799 A | 6/2014 |
| KR | 1020170095801 A | 8/2017 |
| KR | 1020190111179 A | 10/2019 |
| WO | 2016007315 A1 | 1/2016 |

\* cited by examiner

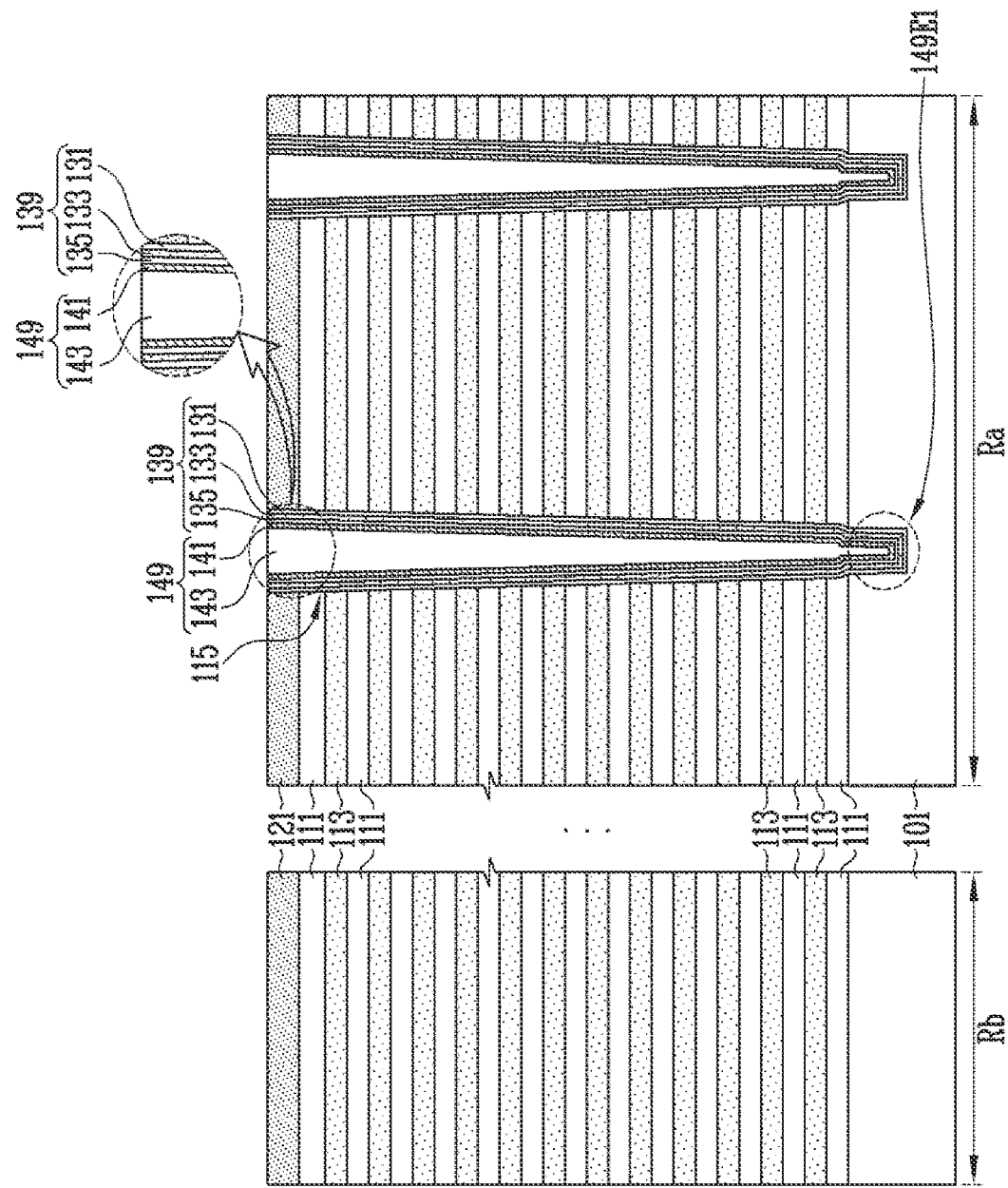

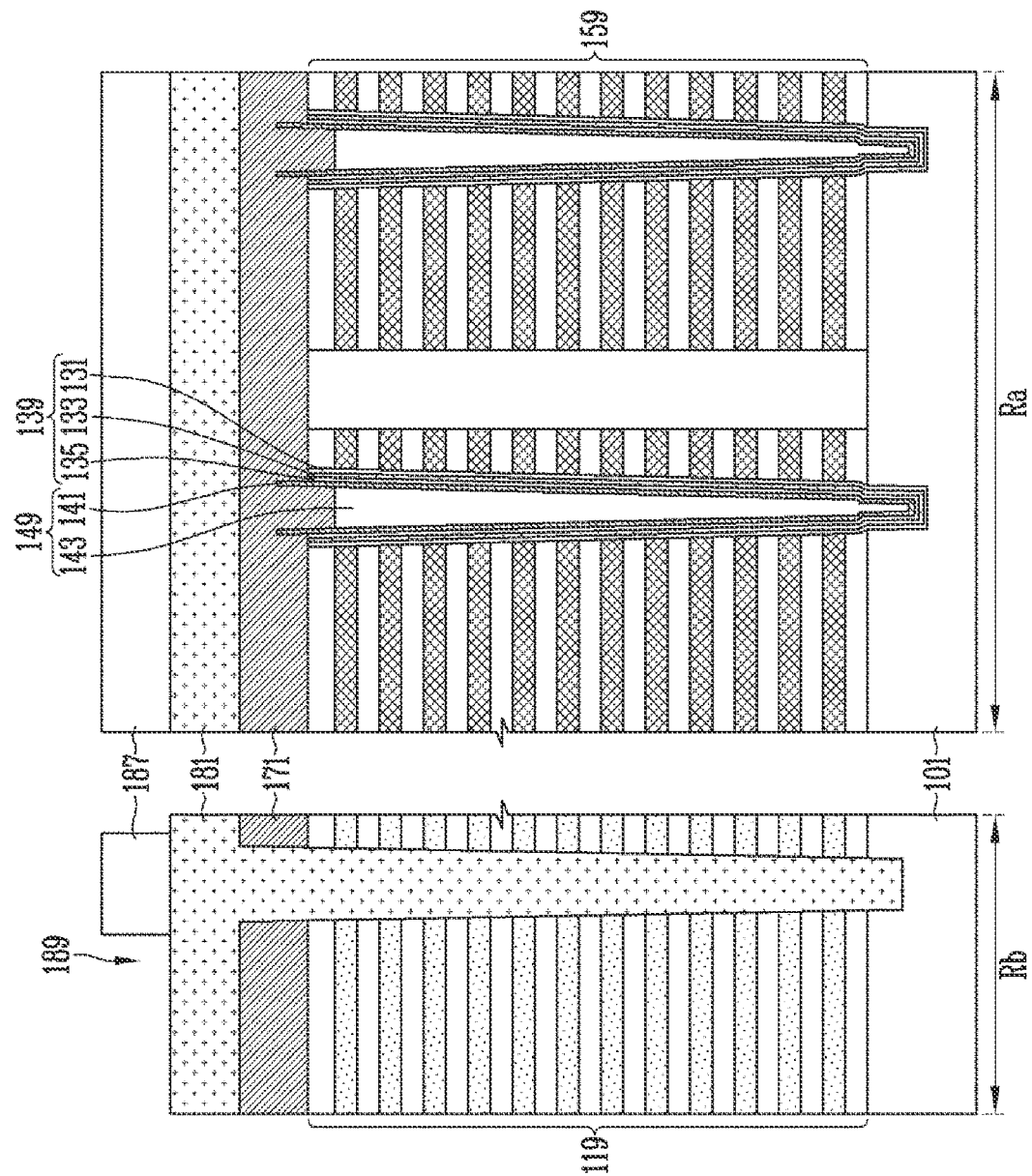

SEMICONDUCTOR MEMORY DEVICE AND MANUFACTURING METHOD THEREOF

CROSS-REFERENCE TO RELATED APPLICATION

The present application is a divisional application of U.S. patent application Ser. No. 16/811,739, filed on Mar. 6, 2020, and claims priority under 35 U.S.C. § 119(a) to Korean patent application number 10-2019-0103297 filed on Aug. 22, 2019, in the Korean Intellectual Property Office, the entire disclosure of which is incorporated herein by reference.

BACKGROUND

1. Technical Field

The present disclosure generally relates to a semiconductor memory device and a manufacturing method thereof, and more particularly, to a three-dimensional semiconductor memory device and a manufacturing method thereof.

2. Related Art

A semiconductor memory device may include a memory cell array including a plurality of memory cells. In order to improve the degree of integration of the semiconductor memory device, the memory cells may be three-dimensionally arranged, Three-dimensional semiconductor memory devices, including three-dimensionally arranged memory cells, may have a complicated manufacturing process and deteriorated operational reliability due to various causes, as compared to two-dimensional semiconductor memory devices.

SUMMARY

In accordance with an aspect of the present disclosure, there is provided a semiconductor memory device including: a common source line; a channel structure extending in a vertical direction from the common source line; a gate stack structure surrounding the channel structure, wherein the gate stack structure includes interlayer insulating layers and conductive patterns alternately stacked on the common source line; and a bit line disposed on the gate stack structure and connected to the channel structure, wherein the channel structure includes: a hollow-type channel layer having a closed end portion facing the bit line and an open end portion facing the common source line.

In accordance with another aspect of the present disclosure, there is provided a semiconductor memory device including: a common source line; a bit line spaced apart from the common source line in a vertical direction; a gate stack structure including interlayer insulating layers and conductive patterns, wherein the including interlayer insulating layers and the conductive patterns are alternately stacked between the common source line and the bit line; a hole penetrating the gate stack structure, the hole having a tapered shape that becomes narrower near the bit line and wider near the common source line; a memory layer formed on a surface of the hole; and a channel structure disposed on the memory layer, the channel structure being connected to the common source line and the bit line.

In accordance with still another aspect of the present disclosure, there is provided a method of manufacturing a semiconductor memory device, the method including: forming a preliminary memory cell array that includes a gate stack structure and a channel structure, wherein the gate stack structure includes interlayer insulating layers and conductive patterns, alternately stacked on a first substrate, and wherein the channel structure has a first end portion that penetrates the gate stack structure and extends into the first substrate; forming a common source line to be in contact with a second end portion of the channel structure, the common source line formed on a first surface of the gate stack structure; removing the first substrate; and forming a bit line connected to the first end portion of the channel structure on a second surface of the gate stack structure that is opposite of the first surface of the gate stack structure.

BRIEF DESCRIPTION OF THE DRAWINGS

FIGS. 5A to 5I are sectional views illustrating an embodiment of step S1A shown in FIG. 4.

DETAILED DESCRIPTION

The specific structural or functional description disclosed herein is merely illustrative for the purpose of describing embodiments according to the concept of the present disclosure. The embodiments according to the concept of the present disclosure may be implemented in various forms, and cannot be construed as limited to the embodiments set forth herein.

In the following description of the embodiments, it will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Embodiments provide a semiconductor memory device capable of simplifying a manufacturing process and improving operational reliability, and a manufacturing method of the semiconductor memory device.

Figure 1:
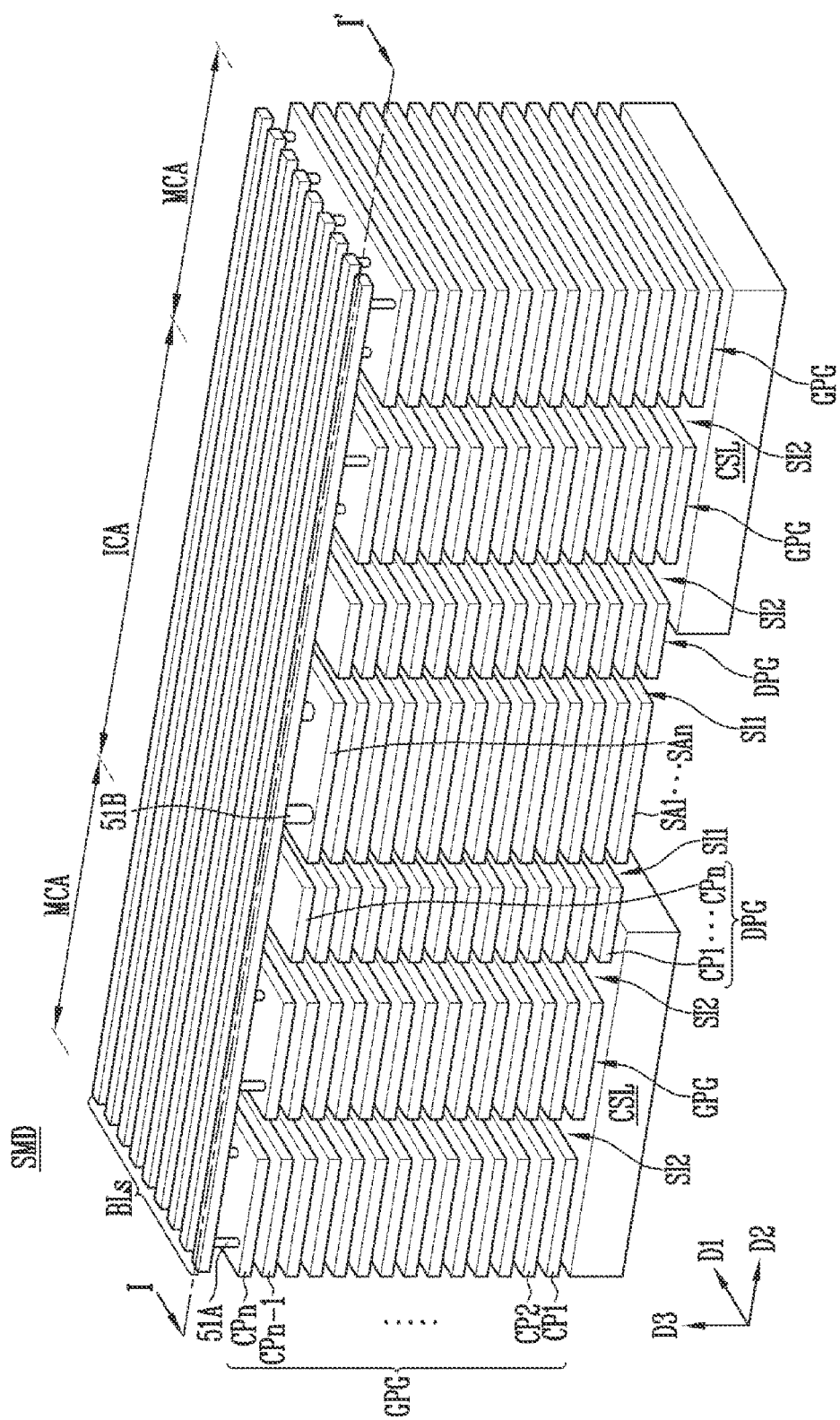
FIG. 1 is a perspective view schematically illustrating memory cell array regions and an interconnection region of a semiconductor memory device in accordance with an embodiment of the present disclosure.

FIG. 1 is a perspective view schematically illustrating memory cell array regions MCA and an interconnection region ICA of a semiconductor memory device SMD in accordance with an embodiment of the present disclosure.

Referring to FIG. 1, the semiconductor memory device SMD may include a plurality of bit lines BLs, a plurality of sacrificial layers SA1 to SAn, a plurality of conductive patterns CP1 to CPn, and a common source line CSL.

Hereinafter, the arrangement direction of the bit lines BLs may be defined by a first direction D1, and the major axis direction of each of the bit lines BLs may be defined by a second direction D2. That is, the bit lines BLs may be arranged to be spaced apart from each other in the first direction D1, and each of the bit lines BLs may extend, in parallel, in the second direction D2. A first axis extending along the first direction D1 may intersect a second axis extending along the second direction D2. For example, the first axis and the second axis may be orthogonal to one another. A third direction D3 may be orthogonal to a D1-D2 plane.

The interconnection region ICA may be disposed between memory cell array regions MCA in the second direction D2. The plurality of bit lines BLs may extend through the memory cell array regions MCA and the interconnection region ICA.

Figure 2:
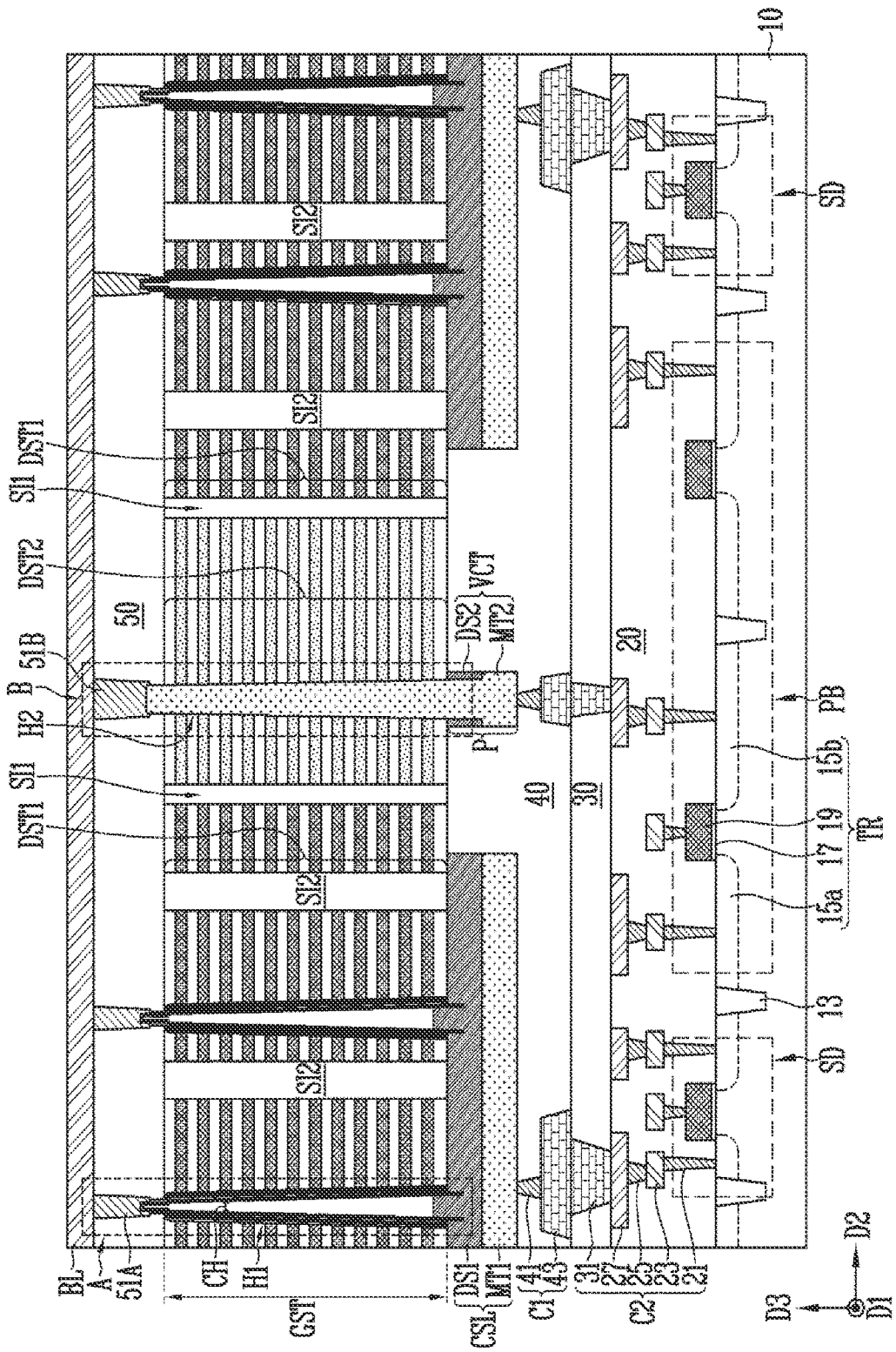
FIG. 2 is a sectional view of the semiconductor memory device shown in FIG. 1.

The plurality of sacrificial layers SA1 to SAn may be disposed within the interconnection region ICA. The plurality of sacrificial layers SA1 to SAn may be stacked to be spaced apart in the third direction D3. The plurality of sacrificial layers SA1 to SAn may be spaced apart from the plurality of conductive patterns CP1 to CPn in the second direction D2, Hereinafter, a space between the plurality of sacrificial layers SA1 to SAn and the plurality of conductive patterns CP1 to CPn is designated as a first slit SI1. The plurality of sacrificial layers SA1 to SAn may overlap with the plurality of bit lines BLs. The plurality of sacrificial layers SA1 to SAn may be penetrated by a vertical contact plug VCT as shown in FIG. 2.

The plurality of conductive patterns CP1 to CPn may be disposed between the plurality of bit lines BLs and the common source line CSL. The plurality of conductive patterns CP1 to CPn may be stacked to be spaced apart from each other in the third direction D3. The plurality of conductive patterns CP1 to CPn may be penetrated by second slits SI2. The second slits SI2 may overlap with the common source line CSL. The plurality of conductive patterns CP1 to CPn may be divided into gate pattern groups GPG and a dummy pattern group DPG by the second slits SI2.

The dummy pattern group DPG may include conductive patterns CP1 to CPn, disposed between the first slit SI1 and the second slit SI2 adjacent to the first slit SI1. An edge of the dummy pattern group DPG, which faces the second slit SI2, may overlap with the common source line CSL.

The gate pattern groups GPG may be disposed in each of the memory cell array regions MCA, and overlap with the common source line CSL. Conductive patterns CP1 to CPn of each of the gate pattern groups GPG may be penetrated by channel structures CH as shown in FIG. 2.

The common source line CSL may be disposed in each of the memory cell array regions MCA. The common source line CSL may extend from an outer edge of the corresponding memory cell array region MCA toward the interconnection region ICA, The common source line CSL might not overlap with the plurality of sacrificial layers SA1 to SAn. In the embodiment, the interior edge of the common source line CSL, which is disposed in the interconnection region ICA, may be disposed between the first slit SI1 and the second slit SI2.

Each of the bit lines BLS may be connected to a corresponding channel structure (CH shown in FIG. 2) via a first contact plug 51A, and be connected to a corresponding vertical contact plug (VCT shown in FIG. 2) via a second contact plug 51B.

FIG. 2 is a sectional view of the semiconductor memory device SMD shown in FIG. 1. FIG. 2 illustrates a section of the semiconductor memory device SMD taken along line shown in FIG. 1.

Referring to FIG. 2, the semiconductor memory device SMD may include a substrate 10 with a source line driving circuit SD and a page buffer circuit PB. The substrate 10 may overlap with gate stack structures GST, a first dummy stack structure DST1, and a second dummy stack structure DST2.

Each of the gate stack structures GST includes a corresponding gate pattern group (GPG shown in FIG. 1), the first dummy stack structure DST1 includes the corresponding dummy pattern group DPG as shown in FIG. 1, and the second dummy stack structure DST2 includes the plurality of sacrificial layers SA1 to SAn as shown in FIG. 1.

A common source line CSL may be disposed between a corresponding gate stack structure GST and the substrate 10.

The substrate 10 may be a bulk silicon substrate, a silicon-on-insulator substrate, a germanium substrate, a germanium-on-insulator substrate, a silicon-germanium substrate, or an epitaxial thin film formed D through a selective epitaxial growth process.

Each of the source line driving circuit SD and the page buffer circuit PB may include a plurality of transistors TR. Each of the transistors TR may be disposed on an active region of the substrate 10, which is defined by an isolation layer 13. Each of the transistors TR may include a gate insulating layer 17 and a gate electrode 19, which are disposed on a corresponding active region, and may include junctions 15a and 15b formed in the active region at both sides of the gate electrode 19, The junctions 15a and 15b may include conductivity-type dopants. For example, one of the junctions (15a or 15b) may be used as a source region, while the other junction (15a or 15b) may be used as a drain region.

The transistors TR may be electrically connected to a memory cell array and a vertical contact plug VCT, which are disposed above the transistors TR, through first connection structures C1 and second connection structures C2. Although the embodiment shows a memory cell array that includes NAND flash memory cells, the present disclosure is not limited thereto, and the memory cell array may include various cross-point arrays. For example, the memory cell array may include DRAM memory cells or variable resistance memory cells.

The memory cell array may include a plurality of memory cell strings. Each of the memory cell strings may include a corresponding gate stack structure GST and channel structures CH that penetrate the gate stack structure GST as shown in region A.

Each of the channel structures CH may be connected to the common source line CSL and a corresponding bit line BL. The gate stack structures GST may be disposed between the common source line CSL and the bit line BL. Each of the channel structures CH may be formed in a corresponding channel hole H1, and the channel hole H1 may penetrate a corresponding gate stack structure GST.

Each of the channel structures CH may extend in the third direction D3 from the common source line CSL. The channel structures CH may respectively include first end portions. The first end portions may protrude toward the bit line BL from the gate stack structures GST. The first end portion of each of the channel structures CH may be in direct contact with a corresponding bit line BL, or be connected to the corresponding bit line BL via a first contact plug 51A as shown in the drawing.

The bit line BL and the first contact plug 51A may be formed of various conductive materials. The first contact plug 51A may be formed in an insulating layer 50. The insulating layer 50 may be disposed between the gate stack structures GST and the bit line BL.

The channel structures CH may respectively include second end portions. The second end portions may protrude from the gate stack structures GST toward the common source line CSL. The second end portions of the channel structures CH may be embedded in the common source line CSL.

The common source line CSL may include a first doped semiconductor pattern DS1 that is in direct contact with the channel structures CH and a first metal pattern MT1. The first metal pattern MT1 may overlap with the first doped semiconductor pattern DS1. The first metal pattern MT1 may be formed on a surface of the first doped semiconductor pattern DS1 and may be electrically connected to the channel structures CH via the first doped semiconductor pattern DS1. The first doped semiconductor pattern DS1 may include a conductivity-type dopant. The conductivity-type dopant may include an n-type dopant for junctions. The conductivity-type dopant may include a counter-doped p-type dopant.

The common source line CSL may be spaced apart from the source line driving circuit SD and the page buffer circuit PB through insulating structures 20, 30, and 40. Each of the insulating structures 20, 30, and 40 may include a single insulating layer or two or more insulating layers. The insulating structures 20, 30, and 40 may extend between the vertical contact plug VCT and the substrate 10. FIG. 2 illustrates an embodiment including first to third insulating structures 20, 30, and 40. The embodiment of the present disclosure is not limited thereto, and a stacked number of insulating structures may be modified in various ways.

The first and second dummy stack structures DST1 and DST2 may be disposed to be parallel to the gate stack structure GST. The first and second dummy stack structures DST1 and DST2 may be disposed at a level substantially equal to that of the gate stack structure GST. The first dummy stack structure DST1 and the gate stack structure GST may be formed in the same stacked structure. The second dummy stack structure DST2 may be penetrated by a contact hole H2, and the contact hole H2 may be filled with the vertical contact plug VCT. The insulating layer 50 may extend to cover the first and second dummy stack structures DST1 and DST2. The vertical contact plug VCT may be electrically connected to the bit line BL through a second contact plug 51B penetrating the insulating layer 50.

The vertical contact plug VCT may include a pad part P extending below a bottom surface of the second dummy stack structure DST2. The bottom surface of the second dummy stack structure DST2 may be defined as one surface of the second dummy stack structure DST2, which faces the substrate 10, The pad part P may be disposed at a level substantially equal to that of the common source line CSL.

The vertical contact plug VCT may include a second doped semiconductor pattern DS2 and a second metal pattern MT2. The second doped semiconductor pattern DS2 may be formed of the same material layer as the first doped semiconductor pattern DS1. The second metal pattern MT2 may be formed of the same material layer as the first metal pattern MT1.

The second metal pattern MT2 may include a portion filling the contact hole H2 and a portion constituting the pad part P. That is, the second metal pattern MT2 may pass through the second dummy stack structure DST2 and extend below the bottom surface of the second dummy stack structure DST2.

The second doped semiconductor pattern DS2 may be part of the pad part P. The second doped semiconductor pattern DS2 may be disposed between the second metal pattern MT2 and the bottom surface of the second dummy stack structure DST2. The second doped semiconductor pattern DS2 may be disposed at a level substantially equal to that of the first doped semiconductor pattern DS1.

The common source line CSL may be electrically connected to the source line driving circuit SD via a corresponding first connection structure C1 and second connection structure C2. The bit line BL may be connected to the page buffer circuit PB via the corresponding second contact plug 51B, vertical contact plug VCT, first connection structure C1, and second connection structure C2.

The first connection structures C1 may be connected to the common source line CSL and the vertical contact plug VCT, Each of the first connection structures C1 may penetrate the first insulating structure 40, covering the common source line CSL and the vertical contact plug VCT. Each of the first connection structures C1 may include various conductive patterns 41 and 43 that are embedded in the first insulating structure 40. Each of the first connection structures C1 may include a first bonding metal 43 that is adhered to a corresponding second connection structure C2.

The second connection structures C2 may be connected to the transistors TR that are included in the source line driving circuit SD and the page buffer circuit PB. Each of the second connection structures C2 may penetrate the second and third insulating structures 30 and 20 that are stacked between the first insulating structure 40 and the substrate 10. Each of the second connection structures C2 may include various conductive patterns 21, 23, 25, 27, and 31. Each of the second connection structures C2 may include a second bonding metal 31 that is adhered to a corresponding first connection structure C1.

Figure 3A:
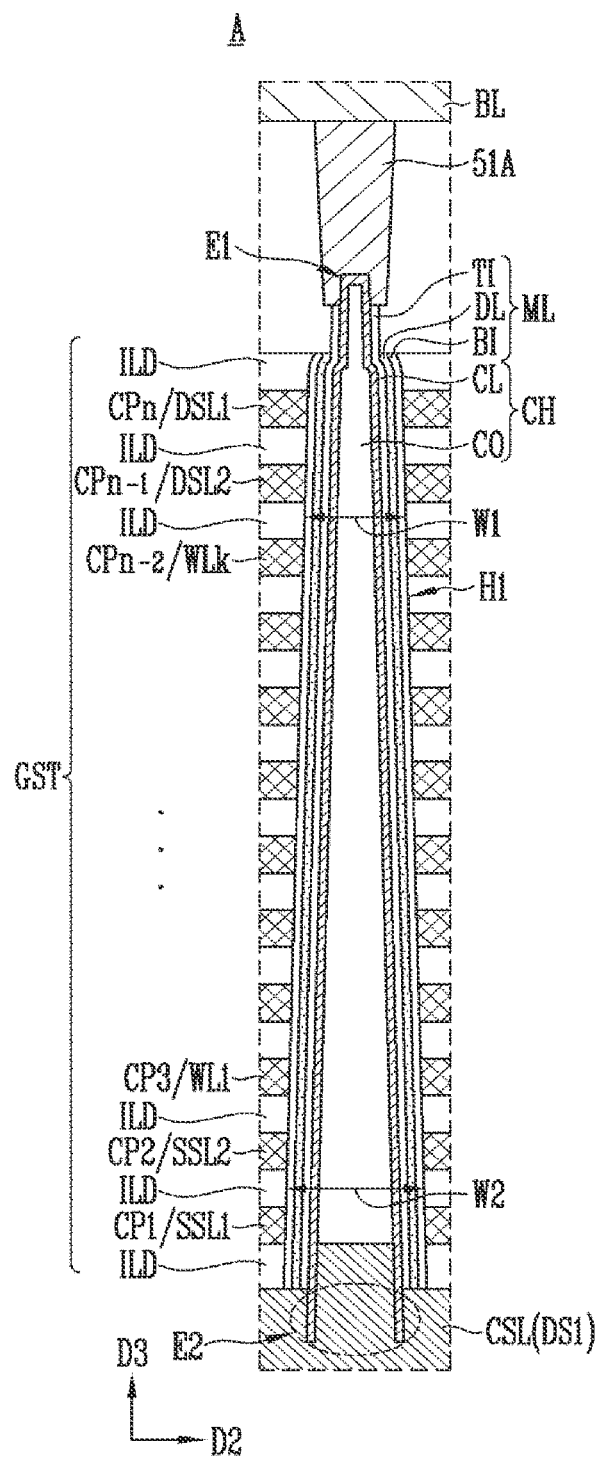
FIG. 3A is an enlarged sectional view of region A shown in FIG. 2
Figure 3B:
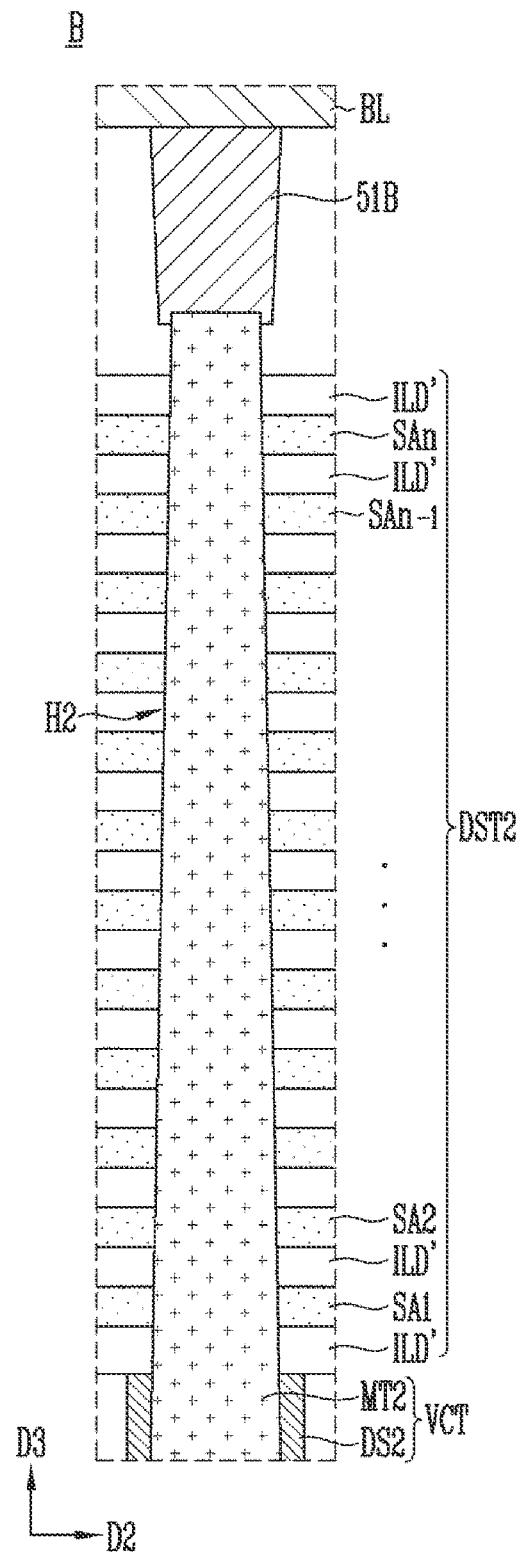
FIG. 3B is an enlarged sectional view of region B shown in FIG. 2.

FIG. 3A is an enlarged sectional view of the region A shown in FIG. 2 and FIG. 3B is an enlarged sectional view of region B shown in FIG. 2.

Referring to FIG. 3A, the gate stack structure GST may include interlayer insulating layers ILD and conductive patterns CP1 to CPn, which are alternately stacked on the common source line CSL, Each of the conductive patterns CP1 to CPn may include various conductive materials such as a doped silicon layer, a metal layer, a metal silicide layer, and a barrier layer, and include two or more kinds of conductive materials. For example, each of the conductive patterns CP1 to CPn may include tungsten and a titanium nitride layer (TiN), the titanium nitride layer surrounding the surface of the tungsten. The tungsten is a low-resistance metal, and therefore, may decrease the resistance of the conductive patterns CP1 to CPn. The titanium nitride layer (TiN) is a barrier layer, and therefore, may prevent direct contact between the tungsten and the interlayer insulating layers ILD.

A first conductive pattern CP1 of the gate stack structure GST, which is adjacent to the common source line CSL, may be used as a first source select line SSL1. An nth conductive pattern CPn of the gate stack structure GST, which is adjacent to the bit line BL, may be used as a first drain select line DSL1, However, the present disclosure is not limited thereto. For example, two or more conductive patterns, adjacent to the common source line CSL and stacked consecutively, may be source select lines. Furthermore, two or more conductive patterns, adjacent to the bit line BL and stacked consecutively, may be used as drain select lines. In an embodiment, the first conductive pattern CP1 of the gate stack structure GST may be used as the first source select line SSL1, and a second conductive pattern CP2 of the gate stack structure GST, which is stacked on the first conductive pattern CP1, may be used as a second source select line SSL2. In an embodiment, the nth conductive pattern CPn of the gate stack structure GST may be used as the first drain select line DSL1, and an (n-1)th conductive pattern CPn-1 of the gate stack structure GST may be used as a second drain select line DSL2. Conductive patterns (e.g., CP3 to CPn-2) of the gate stack structure GST, disposed between adjacent source and drain select lines (e.g., SSL2 and DSL2), may be used as word lines WL1 to WLk.

The channel hole H1, penetrating the gate stack structure GST, may have a tapered shape that becomes narrower near the bit line BL and becomes wider near the common source line CSL. Accordingly, a first width W1 of a portion of the channel hole H1, adjacent to the bit line BL, may be narrower than a second width W2 of another portion of the channel hole H1, adjacent to the common source line CSL.

The channel structure CH may extend in the third direction D3 from the common source line CSL and may be disposed in the channel hole H1. The channel structure CH may include a portion surrounded by the gate stack structure GST, a first end portion protruding from the gate stack structure GST toward the bit line BL, and a second end portion protruding from the gate stack structure GST into the common source line CSL.

The channel structure CH may be disposed on a memory layer ML that is formed on a surface of the channel hole H1 and may be connected to the bit line BL and the common source line CSL. The memory layer ML may extend along a sidewall of the channel structure CH. The memory layer ML may include a tunnel insulating layer TI, a data storage layer DL, and a blocking insulating layer BI, which are stacked on the sidewall of the channel structure CH and are stacked toward a sidewall of the gate stack structure GST. The tunnel insulating layer TI may include silicon oxide through which charges may tunnel. The data storage layer DL may be formed of a charge trapping layer. For example, the charge trapping layer may include silicon nitride. The blocking insulating layer BI may include an oxide capable of blocking charges. The data storage layer DL may be formed of various materials besides the charge trapping layer and may be shaped in various forms between the tunnel insulating layer TI and the blocking insulating layer BI according to the structure of a cell to be implemented. For example, the data storage layer DL may be formed of a material layer including conductive nano dots, a phase change material layer, or a material layer for floating gates.

In an embodiment, the channel structure CH may include a hollow-type channel layer CL and a core insulating layer CO, The core insulating layer CO may fill a central region of the channel layer CL, The core insulating layer CO may fill a central region of the channel hole H and the channel layer CL may be formed between the core insulating layer CO and the memory layer ML. The channel layer CL may extend onto one surface of the core insulating layer CO, which faces the bit line BL. The channel layer CL may include a closed end portion E1 that faces the bit line BL and an open end portion E2 that faces the common source line CSL. The closed end portion E1 may constitute the first end portion of the channel structure CH, and the open end portion E2 may constitute the second end portion of the channel structure. That is, the closed end portion E1 is a portion protruding from the gate stack structure GST toward the bit line BL, and the open end portion E2 is a portion protruding from the gate stack structure GST into the common source line CSL. Also, the open end portion E2 of the channel layer CL may further protrude toward the common source line CSL than the memory layer ML.

The first contact plug 51A may be formed to surround the closed end portion E1 of the channel layer CL and penetrate the memmory layer ML.

The first doped semiconductor pattern DS1 of the common source line CSL may surround a sidewall of the open end portion E2 and extend into the central region of the channel layer CL. Accordingly, a junction overlap region of the channel structure CH may be disposed to be adjacent to the first source select line SSL. The first doped semiconductor pattern DS1 may extend into the central region of the channel layer CL to overlap with a portion of the first source select line SSL1.

In another embodiment, the channel structure CH may include an embedded type channel layer that is embedded in the central region of the channel hole H1, and the core insulating layer CO may be omitted.

The channel layer CL is used as a channel region of a corresponding memory cell string. The channel layer CL may be formed of a semiconductor material. For example, the channel layer CL may include a silicon layer.

According to the above-described structure, memory cells may be formed at intersection portions of the channel structure CH and the word lines WL1 to WLk. Furthermore, a drain select transistor may be formed at an intersection portion of the channel structure CH and each of the first and second drain select lines DSL1 and DSL2. Lastly, a source select transistor may be formed at an intersection portion of the channel structure CH and each of the first and second source select lines SSL1 and SSL2, The memory cells are connected in series between the drain select transistor and the source select transistor through the channel structure CH, to constitute a memory cell string.

Referring to FIG. 38, the second dummy stack structure DST2 may include dummy interlayer insulating layers ILD' and sacrificial layers SA1 to SAn, alternately stacked in the third direction DR3. The dummy interlayer insulating layers ILD' may be disposed at levels substantially equal to those of the interlayer insulating layers ILD shown in FIG. 3A, The sacrificial layers SA1 to SAn may be disposed at levels substantially equal to those of the conductive patterns CP1 to CPn shown in FIG. 3A.

The interlayer insulating layers ILD and the dummy interlayer insulating layers ILD' may be formed of the same material layer. The sacrificial layers SA to SAn may be formed of a material, having an etching rate different from those of the interlayer insulating layers ILD and the dummy interlayer insulating layers ILD'. For example, the interlayer insulating layers ILD and the dummy interlayer insulating layers ILD' may include silicon oxide, while the sacrificial layers SA to SAn may include silicon nitride.

Figure 4:
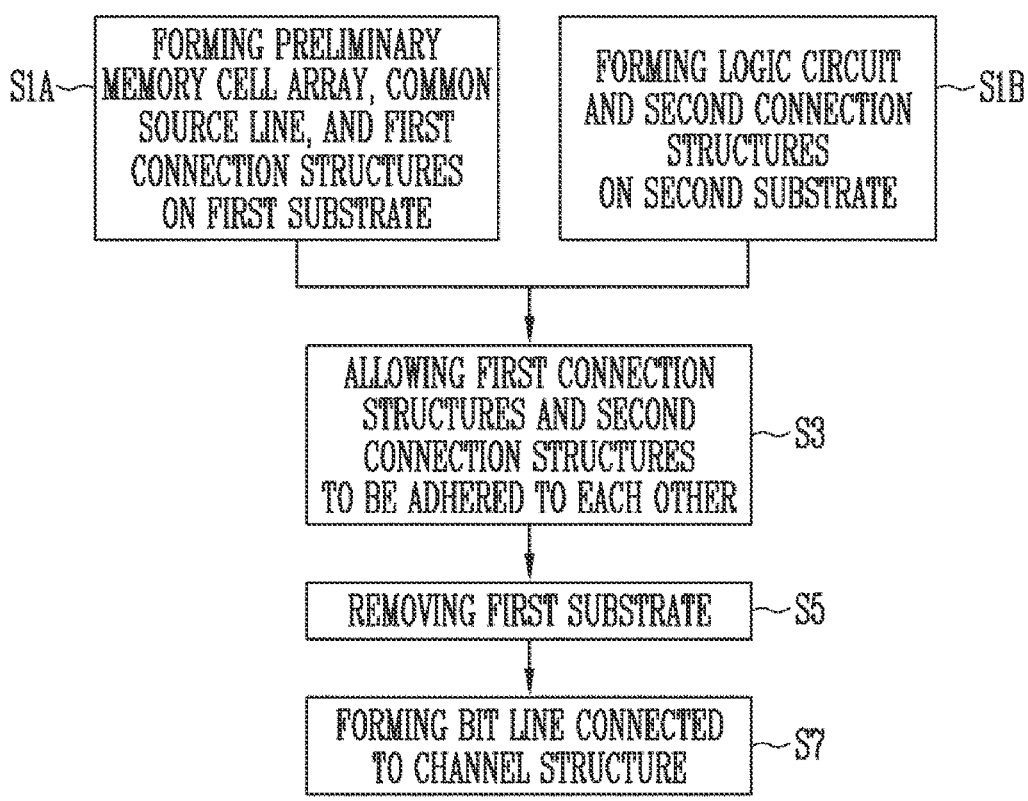
FIG. 4 is a flowchart schematically illustrating a manufacturing method of the semiconductor memory device in accordance with an embodiment of the present disclosure.

FIG. 4 is a flowchart schematically illustrating a manufacturing method of the semiconductor memory device in accordance with an embodiment of the present disclosure.

Referring to FIG. 4, the manufacturing method of the semiconductor memory device may include step S1A, step S1B, step S3, step S5, and step S7.

Step S1A may involve forming a preliminary memory cell array on a first substrate, forming a common source line connected to the preliminary memory cell array, and forming first connection structures connected to the preliminary memory cell array and the common source line.

Step S1B may involve forming a logic circuit on a second substrate, and forming second connection structures that are connected to the logic circuit. The logic circuit may include a source line driving circuit and a page buffer circuit.

Step S3 may involve allowing the first connection structures and the second connection structures to be adhered to each other by aligning the first substrate and the second substrate such that the first connection structures and the second connection structures are in contact with each other.

Step S5 may involve removing the first substrate such that a memory layer of the preliminary memory cell array is exposed.

Step S7 may involve forming a bit line connected to a channel structure of the preliminary memory cell array.

FIGS. 5A to 5I are sectional views illustrating an embodiment of step S1A shown in FIG. 4.

Figure 5A:
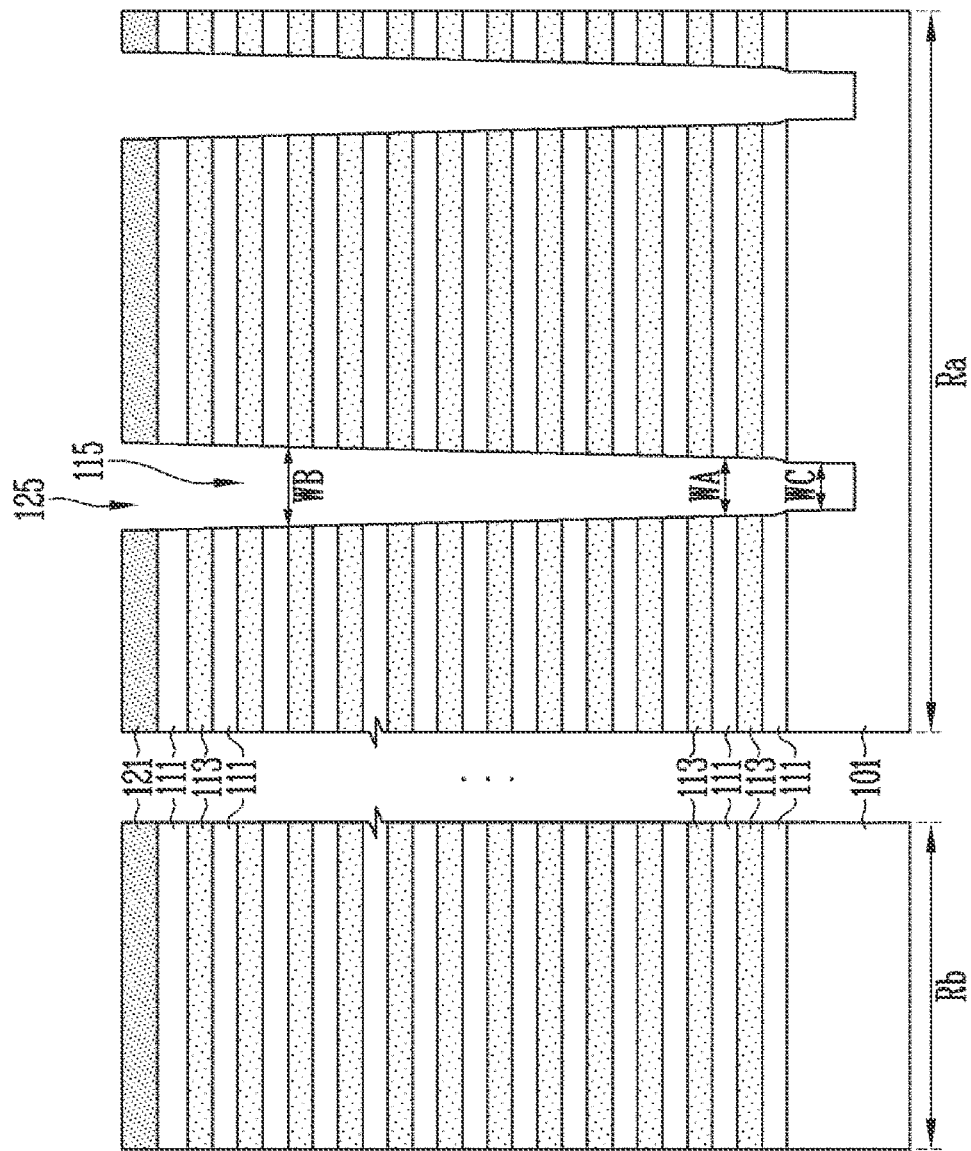

Referring to FIG. 5A, step S1A may involve alternately stacking first material layers 111 and second material layers 113, layer by layer, on a first substrate 101 including a first sacrificial region Ra and a second sacrificial region Rb. The second material layers 113 may be formed of a material different from that of the first material layers 111.

In the embodiment, the first material layers 111 may be formed of an insulating material for the interlayer insulating layer ILD and the dummy interlayer insulating layer ILD', as described with reference to FIG. 2. The second material layers 113 are formed of a material for the sacrificial layers SA1 to SAn and may be formed of a material having an etching rate different from that of the interlayer insulating layer ILD and the dummy interlayer insulating layer ILD', as described with reference to FIG. 2. For example, the first material layers 111 may include silicon oxide, and the second material layers 113 may include silicon nitride.

Subsequent processes are described based on an embodiment in which the first material layers 111 are formed of an insulating material and the second material layers 113 are formed of sacrificial layers. However, the present disclosure is not limited thereto. The properties of the first material layers 111 and the second material layers 113 may be different depending on the embodiment. For example, the first material layers 111 may be formed of an insulating material for the interlayer insulating layer ILD and the dummy interlayer insulating layer ILD', while the second material layers 113 may be formed of a conductive material for the conductive patterns CP1 to CPn.

Subsequently, a first mask pattern 121, including a first opening 125, may be formed on the stacked structure of the first material layers 111 and the second material layers 113. The first mask pattern 121 may be formed using a photolithography process. Subsequently, a channel hole 115, penetrating the first material layers 111 and the second material layers 113, may be formed through the first opening 125 of the first mask pattern 121. The channel hole 115 may extend into the first sacrificial region Ra of the first substrate 101.

The channel hole 115 may have a tapered shape that becomes narrower near the substrate 101. For example, the width WA of a portion of the channel hole 115, adjacent to the first substrate 101 in the stacked structure of the first material layers 111 and the second material layers 113, may be narrower than that width WB of a portion of the channel hole 115, adjacent to the first mask pattern 121 in the stacked structure of the first material layers 111 and the second material layers 113 (WA<WB).

The first substrate 101 may be formed of a material different from those of the first material layers 111 and the second material layers 113. For example, the first substrate 101 may include silicon. Due to the difference in etching rate between the first substrate 101 and the first and second material layers 111 and 113, the width WC of a lower end of the channel hole 115, extending into the substrate 101, may be formed to be narrower than the widths WA and WB in the stacked structure of the first material layers 111 and the second material layers 113 (WC<WA, WB), However, the present disclosure is not limited thereto. For example, the width WC of the lower end of the channel hole 115 may be shaped in various ways through additional etching of the first substrate 101. In an embodiment, the width WC of the lower end of the channel hole 115 may be formed to be wider than the widths WA and WB in the stacked structure of the first material layers 111 and the second material layers 113 through an additional etching process of the first substrate 101.

Referring to FIG. 5B, a memory layer 139 and a channel structure 149 may be formed in the channel hole 115, The channel structure 149 may include a first end portion 149E1 that extends into the first substrate 101. The memory layer 139 may surround a sidewall of the channel structure 149, and extend between the first end portion 149E1 and the first substrate 101.

Step of forming the memory layer 139 and the channel structure 149 may involve sequentially stacking a blocking insulating layer 131, a data storage layer 133, and a tunnel insulating layer 135 on a surface of the channel hole 115, forming a channel layer 141 on the tunnel insulating layer 135, and forming a core insulating layer 143 on the channel layer 141.

The memory layer 139 may include the blocking insulating layer 131, the data storage layer 133, and a tunnel insulating layer 135 and may include the same materials as the blocking insulating layer BI, the data storage layer DL, and the tunnel insulating layer TI, as described with reference to FIG. 3A. The memory layer 139 may be formed in a linear shape, and the channel hole 115 may include a central region that is not filled with the memory layer 139.

The channel structure 149 may include the channel layer 141 and the core insulating layer 143. The channel layer 141 may be formed in a linear shape on a surface of the memory layer 139, and the channel hole 115 may include a central region that is not filled with the channel layer 141. When the channel layer 141 is formed in the linear shape, the central region of the channel hole 115 may be filled with the core insulating layer 143. In another embodiment, the core insulating layer 143 may be omitted, and the channel layer 141 may be expanded to fill the central region of the channel hole 115.

The channel layer 141 may include a silicon layer. The core insulating layer 143 may include oxide.

Figure 5C:
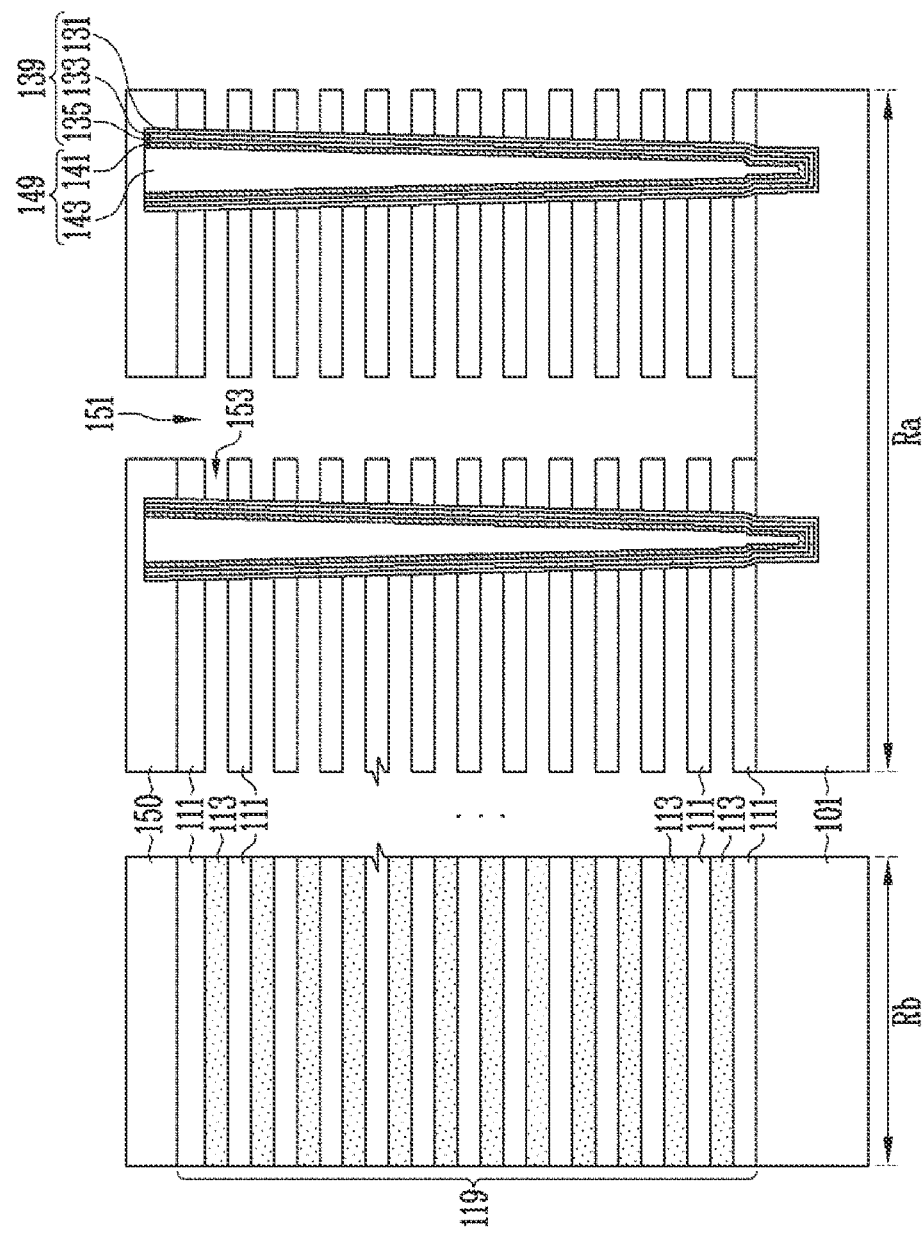

Referring to FIG. 5C, after the first mask pattern 121, shown in FIG. 5B, is removed, an upper insulating layer 150 may be formed. The upper insulating layer 150 may cover the stacked structure of the first material layers 111, the second material layers 113, and the channel structure 149.

Subsequently, a slit 151 may penetrate the upper insulating layer 150, the first material layers 111, and the second material layers 113. The slit 151 may correspond to one of the second slits SI2 shown in FIG. 1. Subsequently, the second material layers 113, overlapping the first sacrificial region Ra of the first substrate 101, may be selectively removed through the slit 151. Horizontal spaces 153 may be defined in regions in which the second material layers 113 are removed. The horizontal spaces 153 may be defined between the first material layers 111 that overlap with the first sacrificial region RA, and the horizontal spaces 153 may be adjacent to each other in a vertical direction. The second material layers 113, overlapping with the second sacrificial region Rb of the substrate 101, may remain. The first material layers 111 and the second material layers 113, which overlap with the second sacrificial region Rb of the substrate 101, may constitute a dummy stack structure 119. The dummy stack structure 119 may correspond to the second dummy stack structure DST2 shown in FIG. 2.

Although not shown in the drawing, before the slit 151 is formed, the first slit 511, described with reference to FIGS. 1 and 2, and an insulating material for filling the first slit 511 may be formed.

Figure 5D:
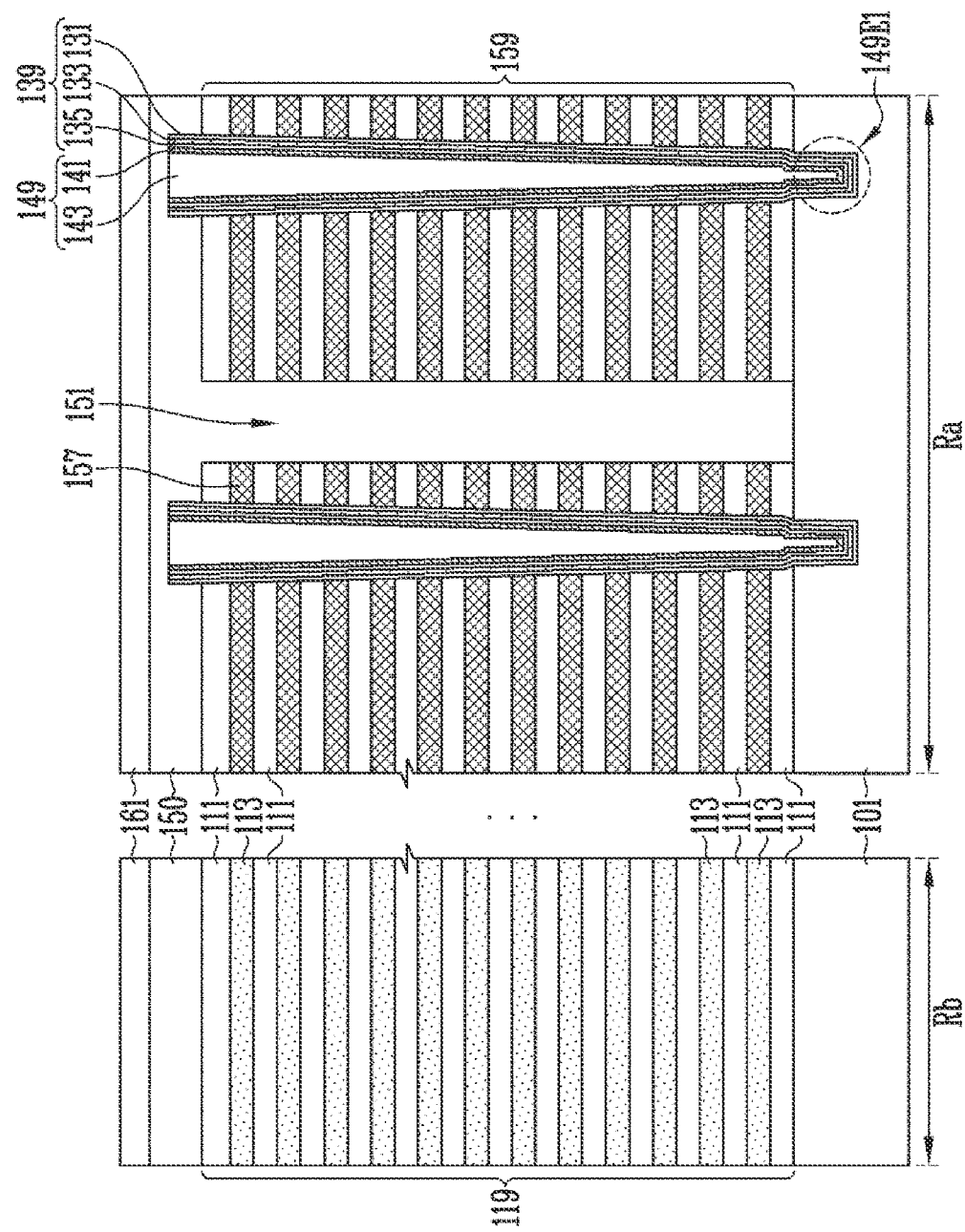

Referring to FIG. 5D, the horizontal spaces 153 shown in FIG. 5C are respectively filled with third material layers 157 through the slit 151. The third material layers 157 may be the conductive patterns CP1 to CPn as shown in FIGS. 1 and 2.

As described above, the sacrificial layers, formed on the first sacrificial region Ra of the substrate 101, are replaced with conductive patterns so that a gate stack structure 159 is formed on the first sacrificial region Ra of the substrate 101.

Through the above-described processes, a preliminary memory cell array may be formed on the first sacrificial region Ra of the substrate 101. The preliminary memory cell array may include the gate stack structure 159, the channel structure 149, and the memory layer 139. The gate stack structure 159 may include interlayer insulating layers and conductive patterns, which are alternately stacked. The channel structure 149 may have the first end portion 149E1 that extends into the first sacrificial region Ra of the substrate 101 and may penetrate the gate stack structure 159, The memory layer 139 may be disposed between the gate stack structure 159 and the channel structure 149 and may extend between the first end portion 149E1 of the channel structure 149 and the first substrate 101.

The above-described preliminary memory cell array may be formed using various processes in addition to the processes as shown in FIGS. 5A to 5D. For example, the first material layers 111 may be formed of an insulating material for the interlayer insulating layers ILD and the dummy interlayer insulating layers ILD', and the second material layers 113 may be formed of a conductive material for the conductive patterns CP1 to CPn. The process of replacing the second material layers 113 with the third material layers 157 may be omitted.

Subsequently, a slit insulating layer 161 may be formed on the upper insulating layer 150. The slit insulating layer 161 may fill the slit 151 to cover a sidewall of the gate stack structure 159.

Figure 5E:
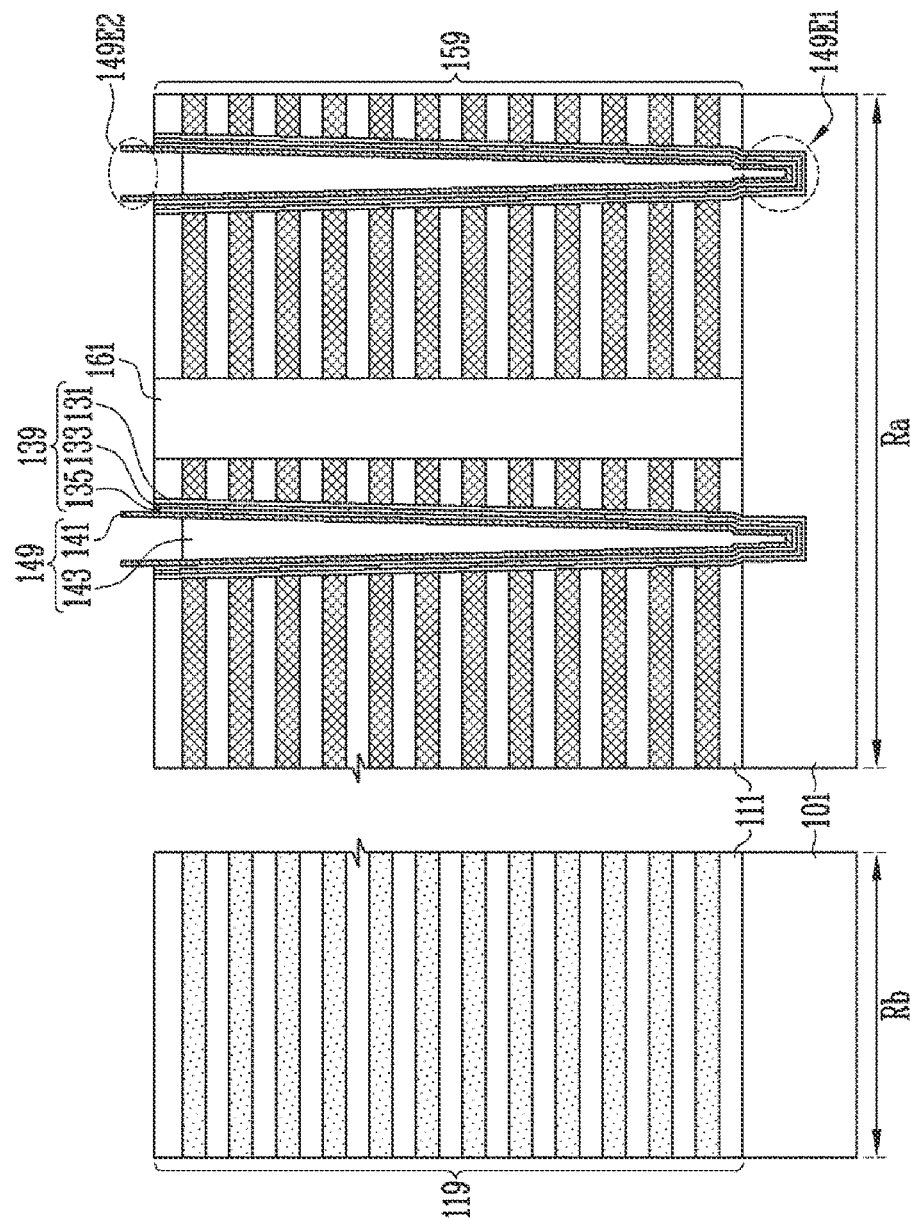

Referring to FIG. 5E, a portion of the slit insulating layer 161, shown in FIG. 5D, and the upper insulating layer 150 may be removed. Subsequently, a portion of the memory layer 139 and a portion of the core insulating layer 143 may be removed. Accordingly, a second end portion 149E2 of the channel structure 149, protruding from the gate stack structure 159, may be exposed.

The slit insulating layer 161 and the upper insulating layer 150 may be removed through a planarization process such as Chemical Mechanical Polishing (CMP). The memory layer 139 and the core insulating layer 143 may be removed through a cleaning process. A portion of each of the upper insulating layer 150 and the slit insulating layer 161 may be removed. When a portion of the core insulating layer 143 is removed, an upper central region of the channel layer 141 may open. A removal amount of the core insulating layer 143 is controlled so that a junction overlap region, defined in a subsequent process, may be optimized according to various designs.

Figure 5F:
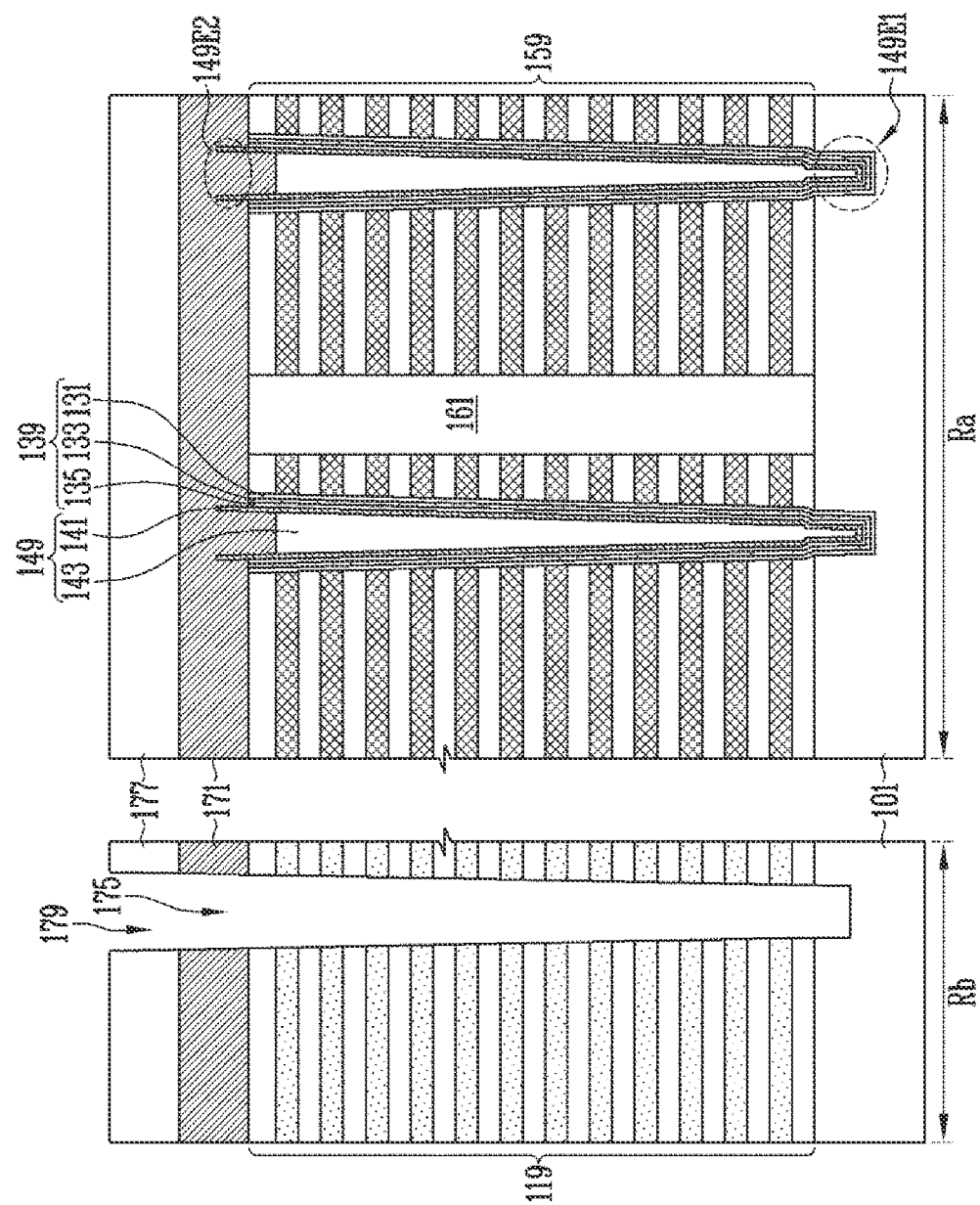

Referring to FIG. 5F, a doped semiconductor layer 171, surrounding the second end portion 149E2 of the channel structure 149, may be formed on one surface of the gate stack structure 159. The doped semiconductor layer 171 may extend onto one surface of the dummy stack structure 119. The doped semiconductor layer 171 may include a conductivity-type dopant. The conductivity-type dopant may include an n-type dopant for junctions. The conductivity-type dopant may include a counter-doped p-type dopant. The doped semiconductor layer 171 may include silicon.

In an embodiment, the doped semiconductor layer 171 may fill the upper central region of the channel layer 141 and may define a junction overlap region facing a sidewall of the channel layer 141. The junction overlap region may be defined after the process of forming the gate stack structure 159 is completed. The gate stack structure 159 may be formed at a high temperature. In the embodiment, since the high temperature generated during the process of forming the gate stack structure 159 has no influence on the junction overlap region, the junction overlap region may be uniformly formed.

In the embodiment, the junction overlap region may overcome the limitations of high temperatures and the dopant injection process. Accordingly, the distribution range of the junction overlap region may be easily controlled to a target range, according to a design, so that the Gate Induced Drain Leakage (GIDL) current for an erase operation may be easily controlled. The GIDL current may be generated at the first source select line SSL1, with reference to FIG. 3A, during the erase operation.

Subsequently, a second mask pattern 177, including a second opening 179, may be formed on the doped semiconductor layer 171. The second mask pattern 177 may be formed using a photolithography process. Subsequently, the doped semiconductor layer 171, the first material layers 111, and the second material layers 113 may be etched through the second opening 179 of the second mask pattern 177, Accordingly, a contact hole 175 may be formed, penetrating the doped semiconductor layer 171 that overlaps the dummy stack structure 119 and penetrating the first material layers 111 and the second material layers 113 of the dummy stack structure 119. The contact hole 175 may overlap with the second sacrificial region Rb of the first substrate 101 and may open the second sacrificial region Rb of the first substrate 101.

Referring to FIG. 5G, after the second mask pattern 177, shown in FIG. 5F, is removed, a metal layer 181 may be formed. The metal layer 181 may fill the contact hole 175 shown in FIG. 5F and may extend onto the doped semiconductor layer 171 which overlaps with the dummy stack structure 119 and the gate stack structure 159. The metal layer 181 may include a low-resistance metal. For example, the metal layer 181 may include tungsten.

Before the metal layer 181 is formed, a barrier layer may be further formed on a surface of the contact hole 175, shown in FIG. 5F, and a surface of the doped semiconductor layer 171. The barrier layer may include a material for prevent metal diffusion. For example, the barrier layer may include a titanium nitride layer, a tungsten nitride layer, a tantalum nitride layer, and the like.

Subsequently, a third mask pattern 187, including a third opening 189, may be formed on the metal layer 181.

Figure 5H:
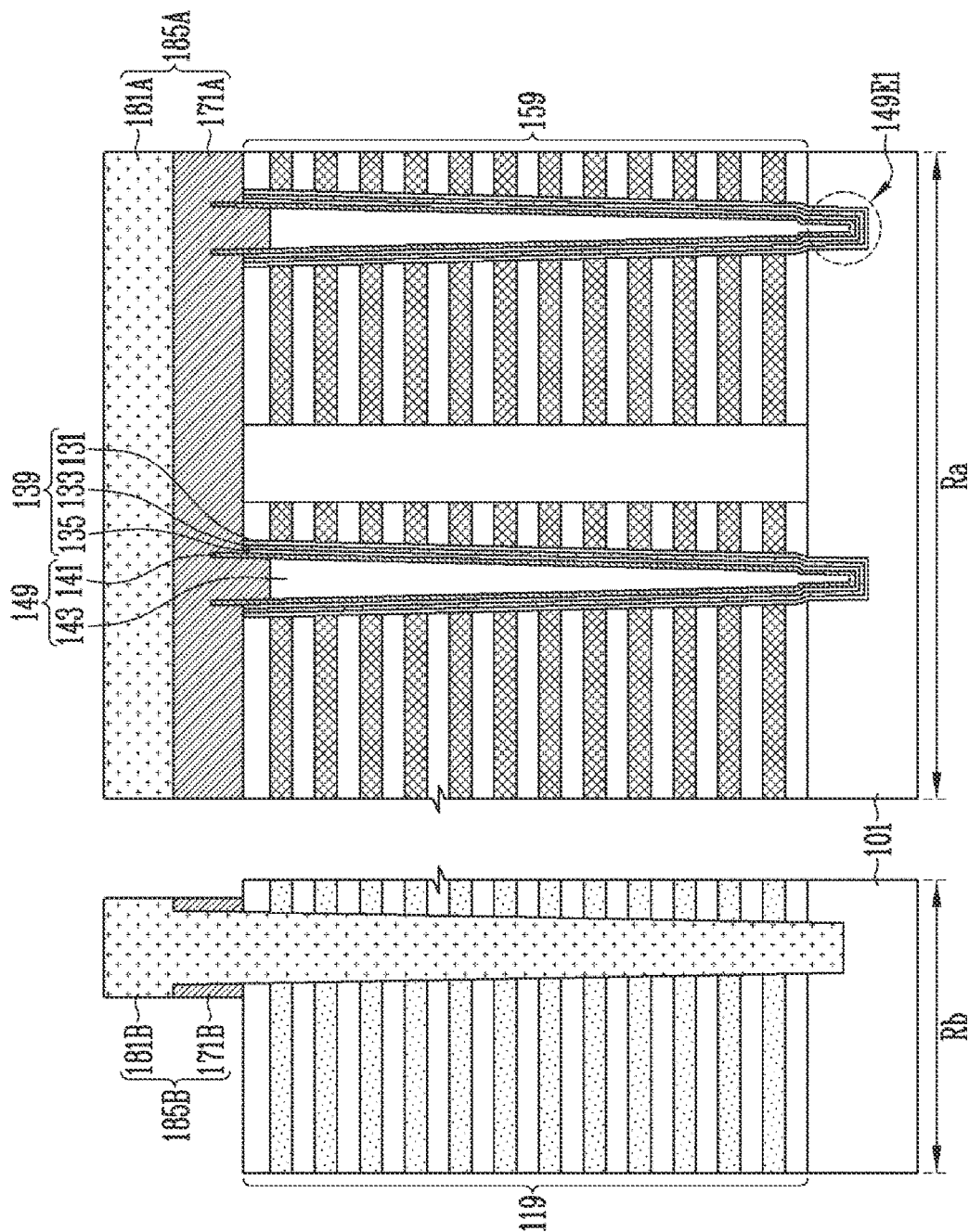
Figure 51:
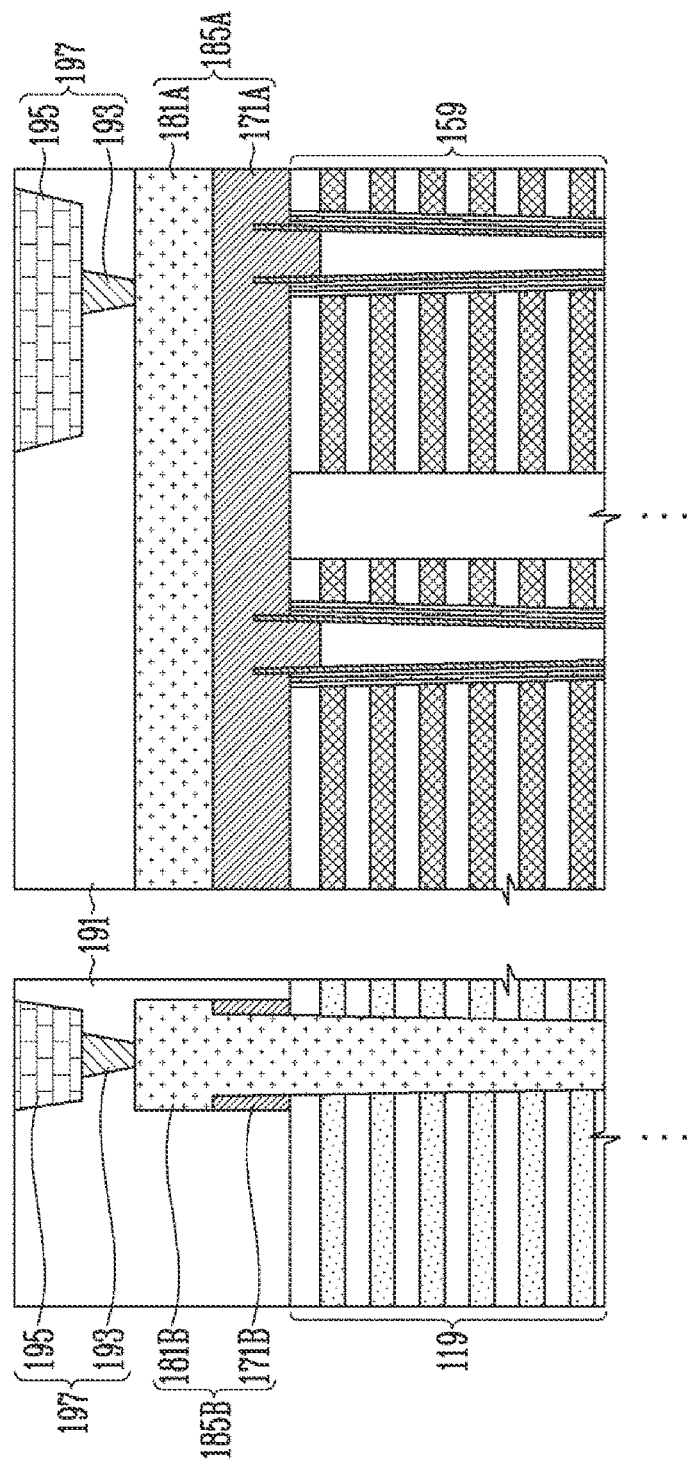

Referring to FIG. 5H, the metal layer 181 and the doped semiconductor layer 171 may be etched through the third opening 189, shown in FIG. 5G, using the third mask pattern 187, shown in FIG. 5G, as an etch barrier. Accordingly, a portion of the metal layer 181 is removed so that the metal layer 181 may be separated into a first metal pattern 181A and a second metal pattern 181B. In addition, a portion of the doped semiconductor layer 171 is removed so that the doped semiconductor layer 171 may be separated into a first doped semiconductor pattern 171A and a second doped semiconductor pattern 171B.

The first metal pattern 181A and the first doped semiconductor pattern 171A may constitute a common source line 185A that overlaps with the gate stack structure 159. The second metal pattern 181B and the second doped semiconductor pattern 1713 may constitute a vertical contact plug 1853. In the embodiment, the vertical contact plug 1853, penetrating the dummy stack structure 119, is formed using the process of forming the common source line 185A so that a manufacturing process of the semiconductor memory device may be simplified.

Referring to FIG. 5I, a cell-side insulating structure 191, covering the vertical contact plug 1853 and the common source line 185A and first connection structures 197, embedded in the cell-side insulating structure 191, may be formed. The cell-side insulating structure 191 may be configured with a single insulating layer or may be configured with two or more multi-layered insulating layers. Each of the first connection structures 197 may include a first bonding metal 195 that is exposed to the outside of the cell-side insulating structure 191. The first connection structures 197 may be respectively connected to the vertical contact plug 1853 and the common source line 185A.

Figure 6:
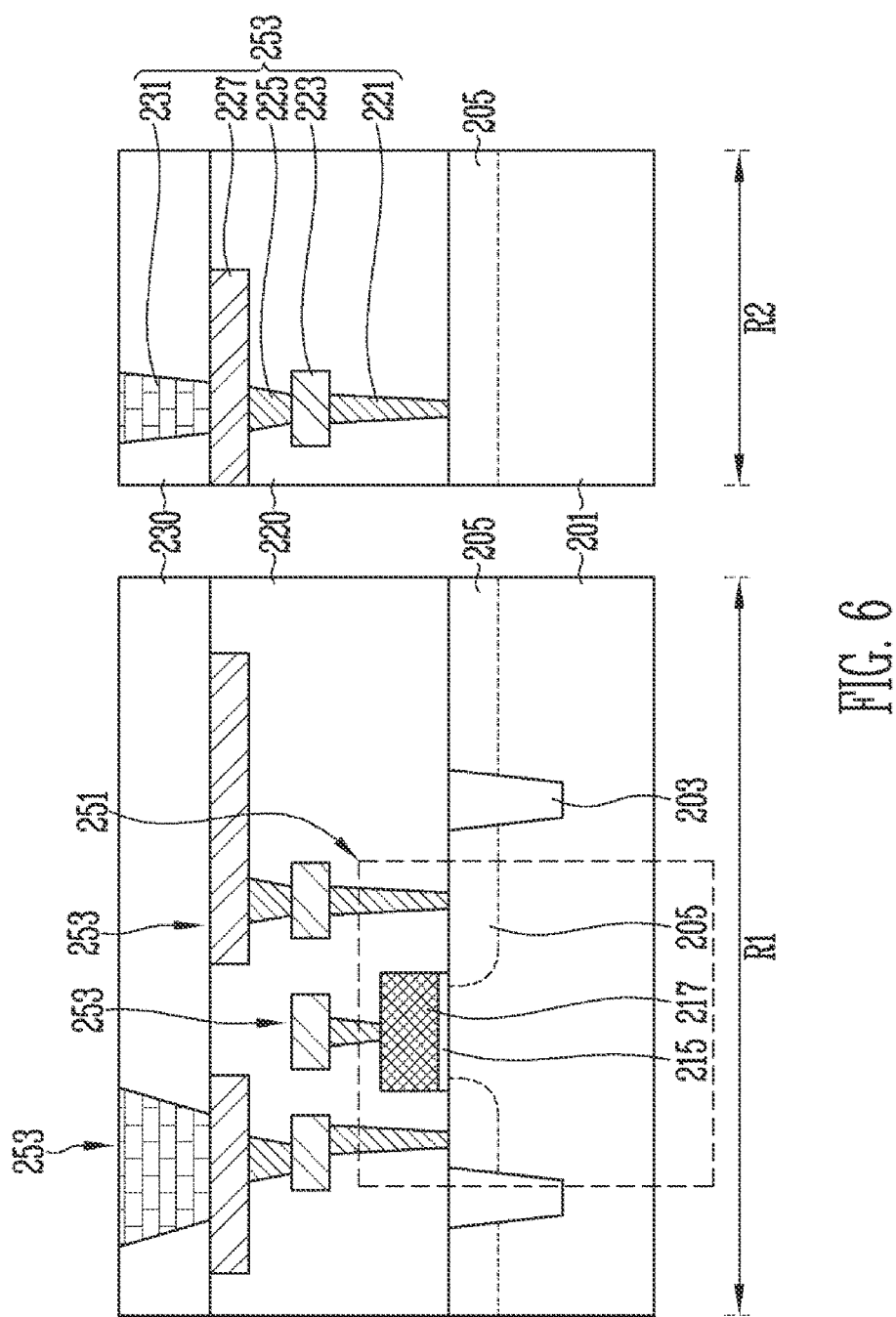
FIG. 6 is a sectional view illustrating an embodiment of step S1B shown in FIG. 4.

FIG. 6 is a sectional view illustrating an embodiment of step S1B shown in FIG. 4.

Referring to FIG. 6, step S1B may involve forming a plurality of transistors 251 on a second substrate 201 which includes a first region R1 and a second region R2. The plurality of the transistors 251 may constitute a logic circuit. Each of the transistors 251 may be formed in an active region of the second substrate 201 that is defined by an isolation layer 203, Each of the transistors 251 may include a gate insulating layer 215 and a gate electrode 217 that are stacked on a corresponding active region. Each of the transistors 251 may include junctions 205, formed in an active region at both sides of a corresponding gate electrode 215. The junctions 205 may include a conductivity-type dopant to implement a corresponding transistor. For example, the junctions 205 may include an n-type dopant or p-type dopant.

The second substrate 201 may be a bulk silicon substrate, a silicon-on-insulator substrate, a germanium substrate, a germanium-on-insulator substrate, a silicon-germanium substrate, or an epitaxial thin film formed through a selective epitaxial growth process.

A transistor 251, formed in the first region R1, may be included in the source line driving circuit SD, as shown in FIG. 2. Furthermore, a transistor 251, formed in the second region R2, may be included in the page buffer circuit PB, as shown in FIG. 2.

Step S1B may involve forming peripheral circuit-side insulating structures 220 and 230 covering the transistors 251 constituting the logic circuit and second connection structures 253 penetrating the peripheral circuit-side insulating structures 220 and 230.

The peripheral circuit-side insulating structures 220 and 230 may include a first insulating structure 220 that covers the transistors 251 and a second insulating structure 230 stacked on the first insulating structure 220. The first insulating structure 220 may be configured with a single insulating layer or nay be configured with two or more multi-layered insulating layers.

Each of the second connection structures 253 may include a plurality of conductive patterns 221, 223, 225, and 227 that penetrate the first insulating structure 220 and may include a second bonding metal 231 that is connected to the plurality of conductive patterns 221, 223, 225, and 227 that penetrate the second insulating structure 230. The plurality of conductive patterns 221, 223, 225, and 227 may be connected to a corresponding transistor 251.

Figure 7:
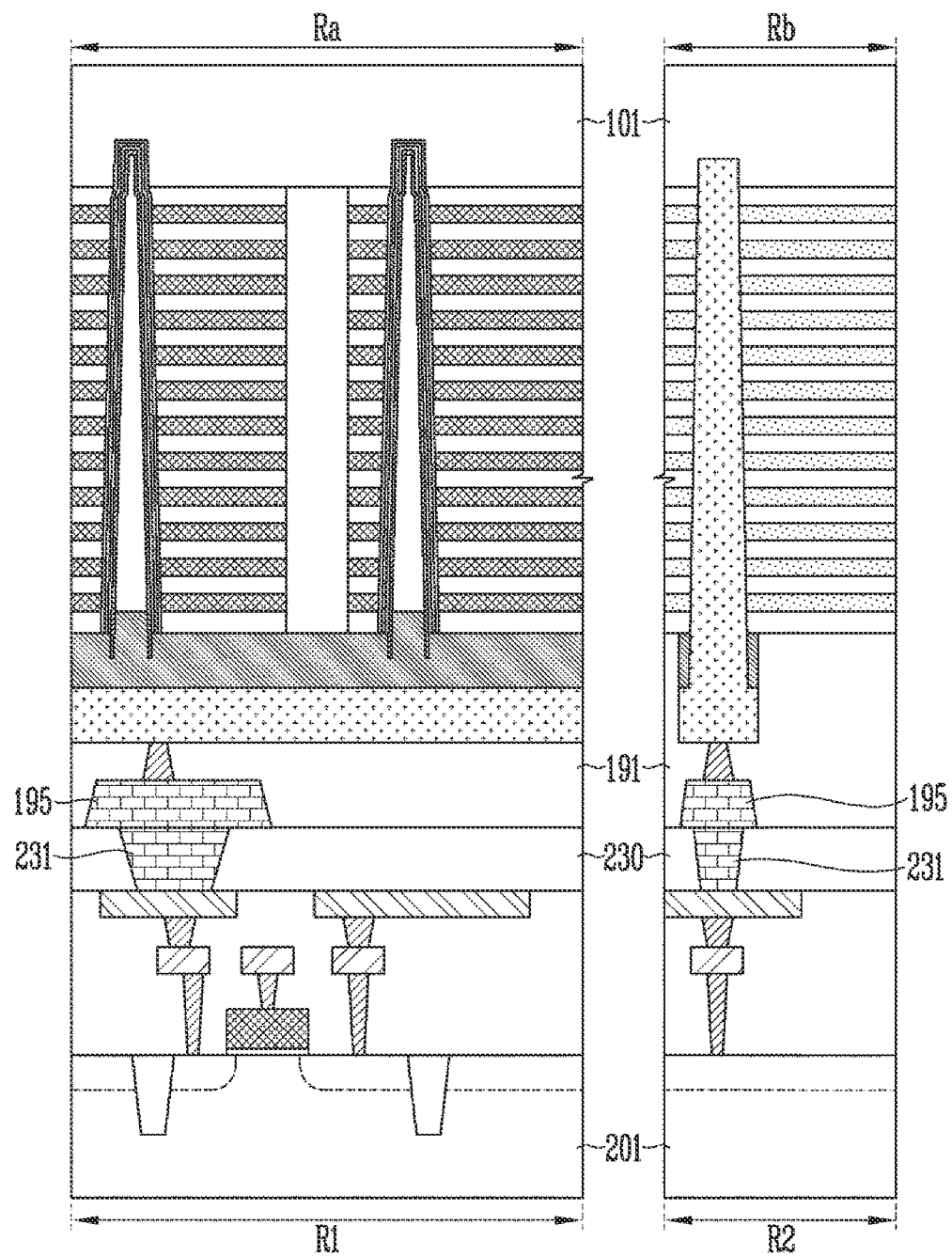
FIG. 7 is a sectional view illustrating an embodiment of step S3 shown in FIG. 4.

FIG. 7 is a sectional view illustrating an embodiment of step S3 shown in FIG. 4.

Referring to FIG. 7, step S3 may involve aligning the first substrate 101 and the second substrate 201 such that the first bonding metal 195 on the first substrate 101 and the second bonding metal 231 on the second substrate 201 may be in contact with each other. The first substrate 101 and the second substrate 201 may be aligned such that the first sacrificial region Ra of the first substrate 101 faces the first region R1 of the second substrate 201, and the second sacrificial region Rb of the first substrate 101 faces the second region R2 of the second substrate 201. The first bonding metal 195 and the second bonding metal 231 may include various metals. For example, the first bonding metal 195 and the second bonding metal 231 may include copper.

Subsequently, step S3 may involve allowing the first bonding metal 195 and the second bonding metal 231 to adhere to each other. After heat is applied to the first bonding metal 195 and the second bonding metal 231, the first bonding metal 195 and the second bonding metal 231 may be cured. However, the present disclosure is not limited thereto, and various processes for connecting the first bonding metal 195 and the second bonding metal 231 may be implemented.

Figure 8A:
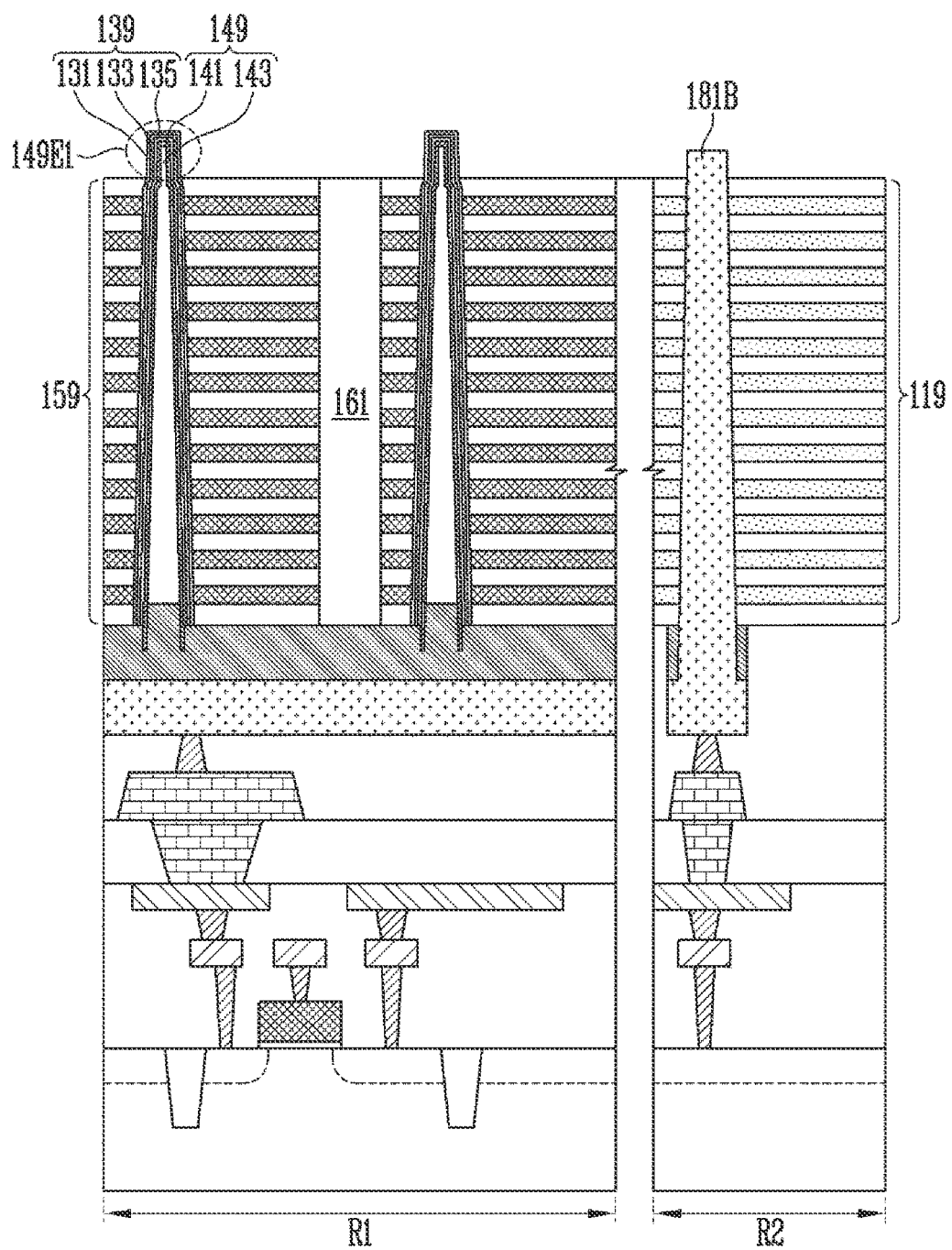
FIGS. 8A and 8B are sectional views illustrating an embodiment of step S5 shown in FIG. 4.
Figure 8B:
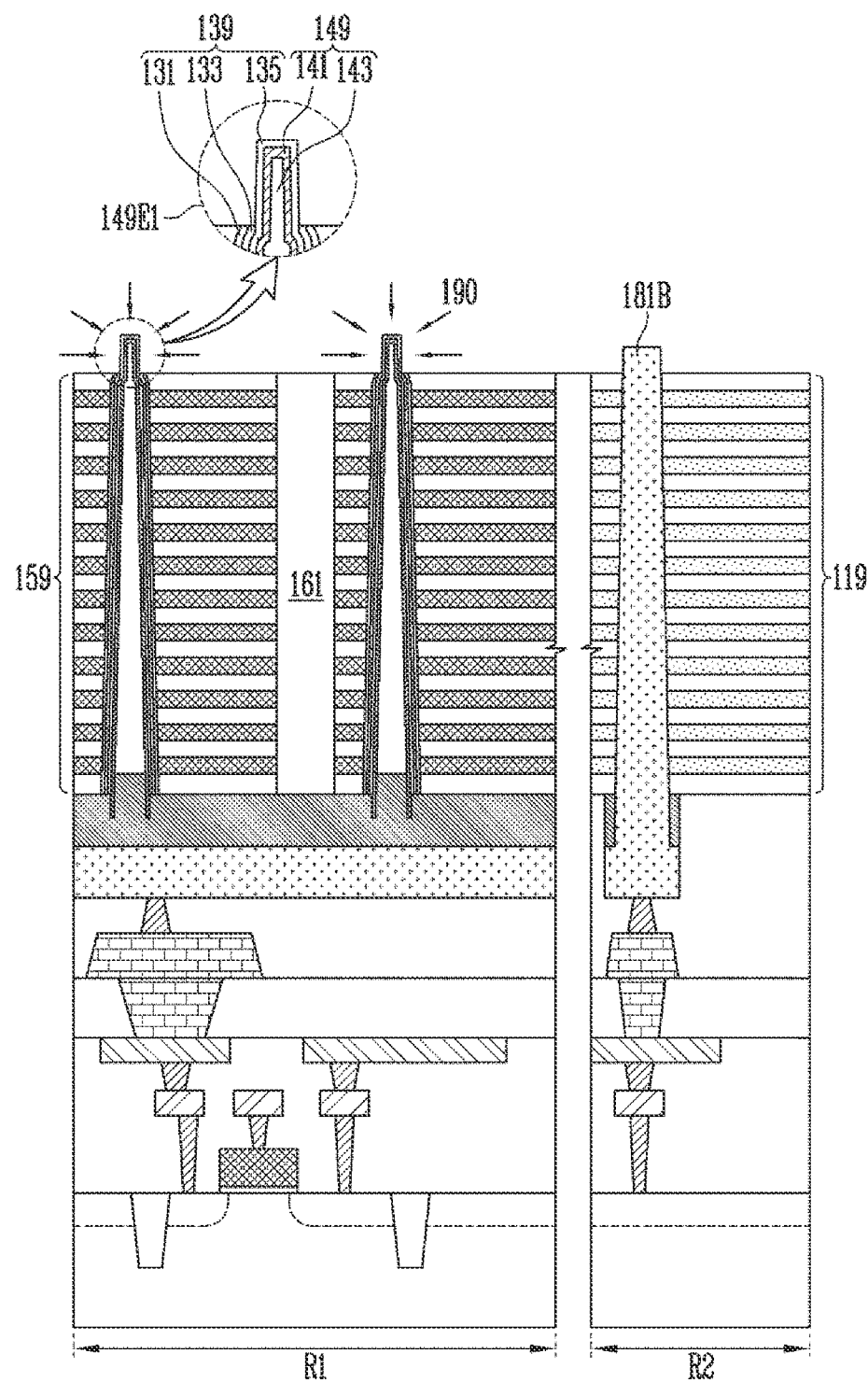

FIGS. 8A and 8B are sectional views illustrating an embodiment of step S5 shown in FIG. 4.

Referring to FIG. 8A, in step S5, the first substrate 101 shown in FIG. 7 may be removed. When the first substrate 101 is removed, the memory layer 139 may serve as an etch stop layer. Accordingly, the first end portion 149E1 of the channel structure 149 may be protected by the memory layer 139, When the first substrate 101 is removed, an end portion of the second metal pattern 181B may be exposed.

Referring to FIG. 8B, a conductivity-type dopant 190 may be injected into the first end portion (149E1 shown in FIG. 8A) of the channel structure 149, which protrudes from the gate stack structure 159. The conductivity-type dopant 190 may include an n-type dopant for junctions. The conductivity-type dopant 190 may include a p-type dopant for counter doping.

The conductivity-type dopant 190 may be injected in a state in which an end portion of the channel layer 141 is covered by at least one of the blocking insulating layer 131, the data storage layer 133, and the tunnel insulating layer 135. In an embodiment, before the conductive type dopant 190 is injected, the tunnel insulating layer 135 may be exposed by removing a portion of the blocking insulating layer 131 and a portion of the data storage layer 133, which cover the end portion of the channel layer 141, Subsequently, the conductivity-type dopant 190 may be injected in a state in which the end portion of the channel layer 141 is covered by the tunnel insulating layer 135.

Figure 9A:
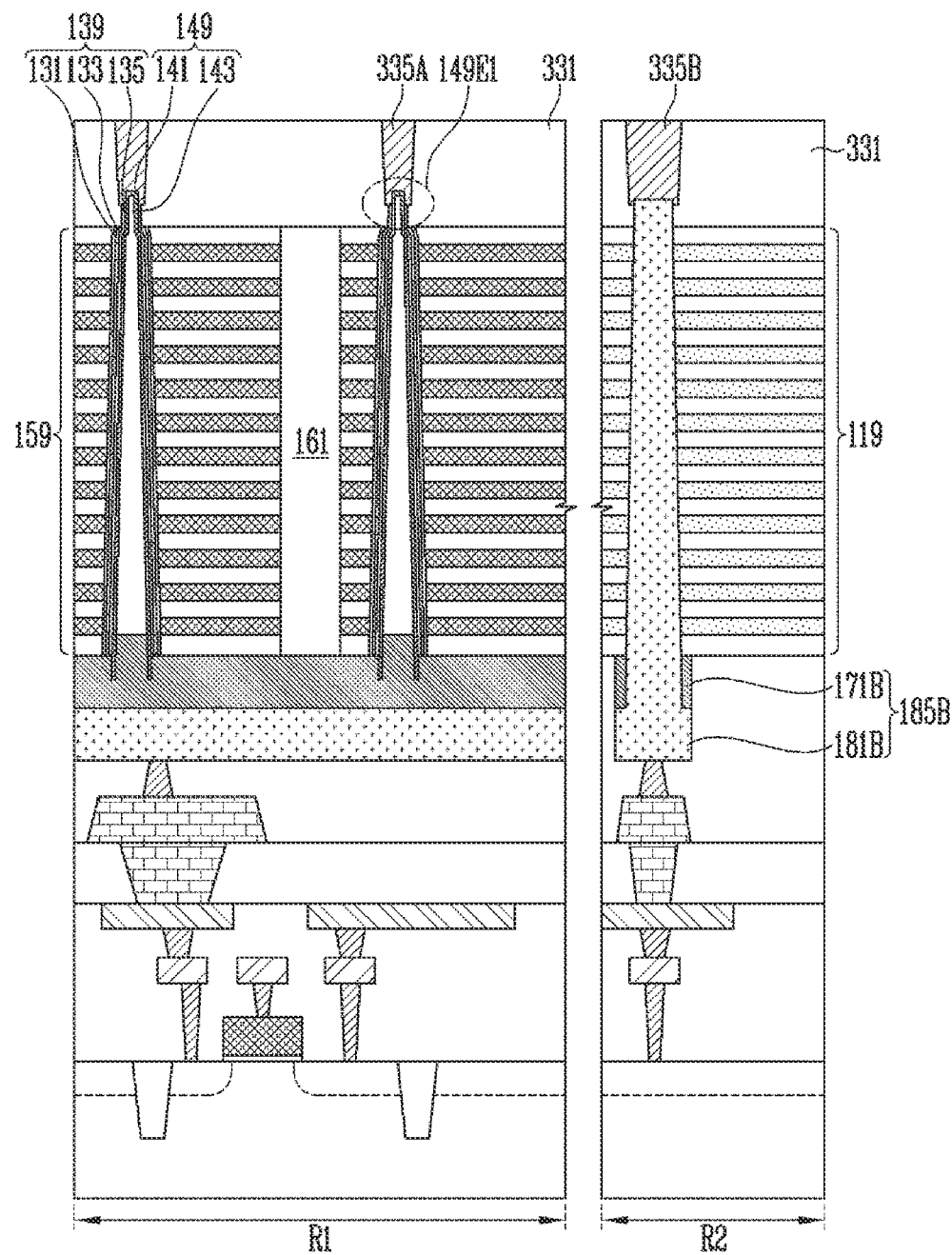
FIGS. 9A and 9B are sectional views illustrating an embodiment of step S7 shown in FIG. 4.
Figure 9B:
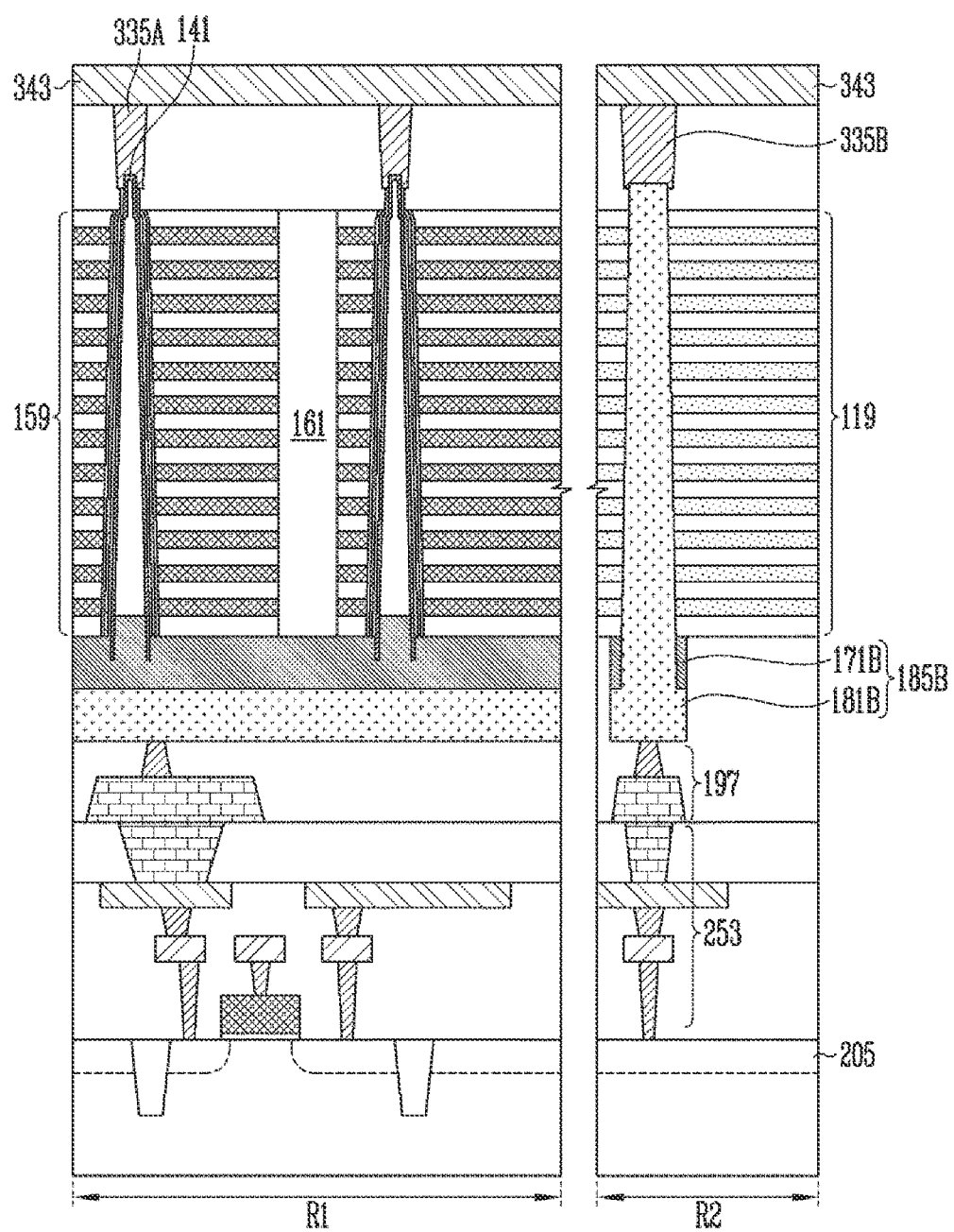

FIGS. 9A and 9B are sectional views illustrating an embodiment of step S7 shown in FIG. 4.

Referring to FIG. 9A, step S7 may involve forming a first insulating layer 331 on the gate stack structure 159 and the dummy stack structure 119 to cover the memory layer 139 and the second metal pattern 1816 and forming a first contact plug 335A and a second contact plug 3356 that penetrate the first insulating layer 331.

The first contact plug 335A may penetrate the first insulating layer 331 and the memory layer 139 and may be in direct contact with the first end portion 149E1 of the channel structure 149. The second contact plug 3356 may penetrate the first insulating layer 331 and may be in direct contact with the end portion of the second metal pattern 1816 penetrating the dummy stack structure 119.

Referring to FIG. 9B, step S7 may involve forming a bit line 343 that is connected to the first contact plug 335A and the second contact plug 335B.

The bit line 343 may be connected to the channel layer 141 via the first contact plug 335A and may be connected to the vertical contact plug 1856 via the second contact plug 3356. The channel layer 141 may be connected to the junction 205 of the transistor included in the page buffer circuit via the first contact plug 335A, the bit line 343, the second contact plug 3358, the vertical contact plug 1858, the first connection structure 197, and the second connection structure 253.

Figure 10:
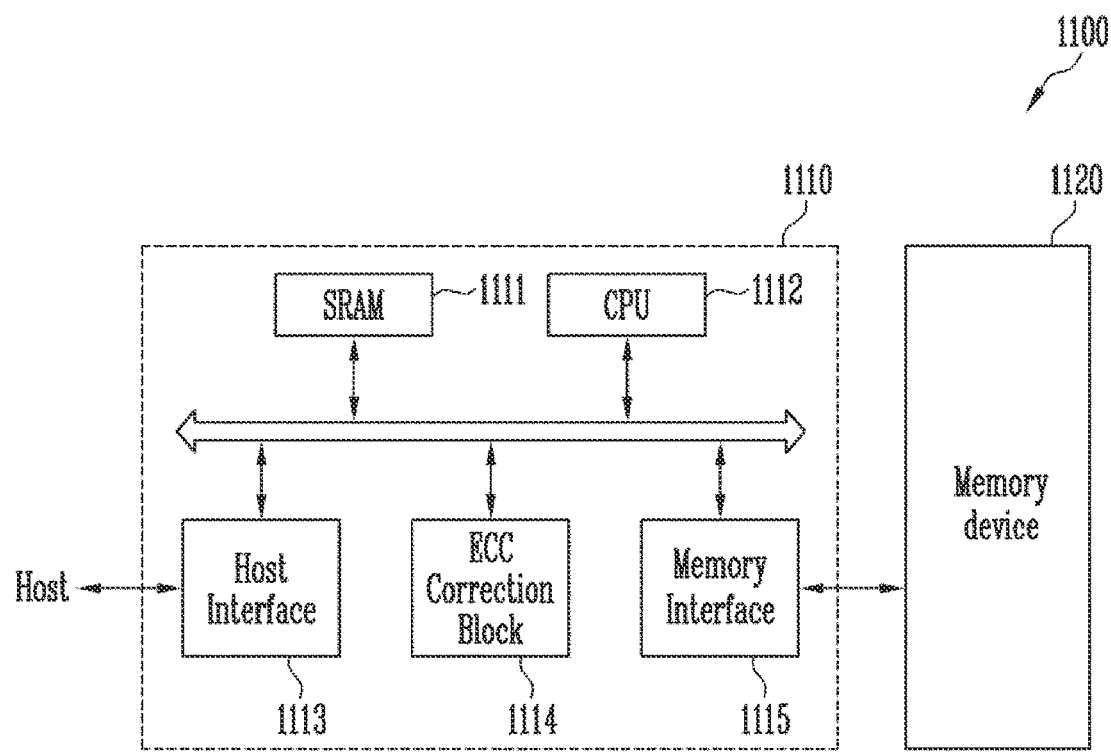
FIG. 10 is a block diagram illustrating a configuration of a memory system in accordance with an embodiment of the present disclosure.

FIG. 10 is a block diagram illustrating a configuration of a memory system 1100 in accordance with an embodiment of the present disclosure.

Referring to FIG. 10, the memory system 1100 in accordance with the embodiment of the present disclosure includes a memory device 1120 and a memory controller 1110.

The memory device 1120 may be a mufti-chip package configured with a plurality of flash memory chips. The memory device 1120 may include the semiconductor memory device described with reference to FIGS. 1, 2, 3A, and 38, For example, the semiconductor memory device may include a common source line, a channel structure extending in a vertical direction from the common source line, a gate stack structure surrounding the channel structure, and a bit line disposed on the gate stack structure, the bit line being connected to the channel structure. In an embodiment, the channel structure may include a hollow-type channel layer having an open end portion facing the common source line and a closed end facing the bit line. In another embodiment, the channel structure may be disposed in a hole having a tapered shape that becomes narrower as coming closer to the bit line from the common source line.

The memory controller 1110 is configured to control the memory device 1120, and may include a static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120, and the memory interface 1115 interfaces with the memory device 1120. In addition, the memory controller 1110 may further include an ROM for storing code data for interfacing with the host, and the like.

Figure 11:
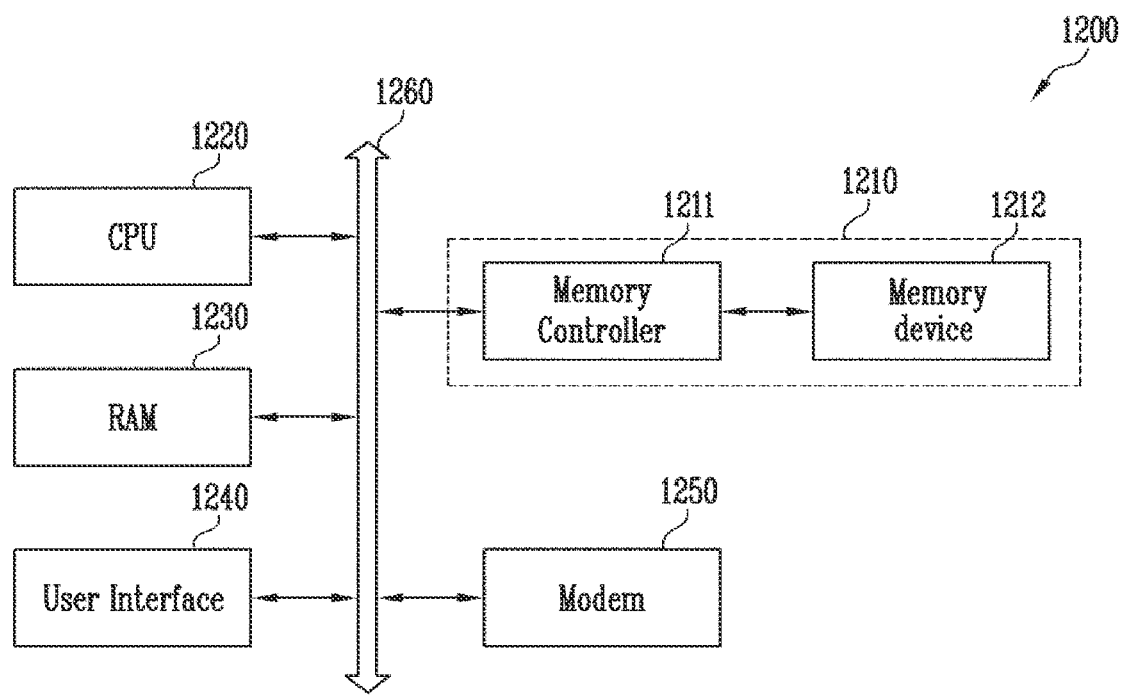
FIG. 11 is a block diagram illustrating a configuration of a computing system in accordance with an embodiment of the present disclosure.

The memory system 1100 configured as described above may be a memory card or a Solid State Drive (SSD), in which the memory device 1120 is combined with the controller 1110, For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (DATA) protocol, a Small Computer Small Interface (SCSI) protocol, an Enhanced Small Disk Interface (ESDI) protocol, and an Integrated Drive Electronics (IDE) protocol, FIG. 11 is a block diagram illustrating a configuration of a computing system in accordance with an embodiment of the present disclosure.

Referring to FIG. 11, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile DRAM, and the like may be further included.

In accordance with the present disclosure, a connection method of the common source line and the channel structure is simple, so that the manufacturing process of the semiconductor memory device may be simplified.

In accordance with the present disclosure, a phenomenon in which the junction overlap region of the channel structure is changed due to influence of a thermal process is minimized, so that Gate Induced Drain Leakage (GIDL) current necessary for an erase operation may be easily controlled. Accordingly, the operational reliability of the semiconductor memory device may be improved,

What is claimed is:

1. A semiconductor memory device comprising:
   a common source line;
   a bit line spaced apart from the common source line in a vertical direction;
   a gate stack structure including interlayer insulating layers and conductive patterns, and including a hole, wherein the interlayer insulating layers and the conductive patterns are alternately stacked between the common source line and the bit line, and wherein the hole has a tapered shape that becomes narrower near the bit line and wider near the common source line;
   a memory layer formed along the hole; and
   a channel structure disposed on the memory layer, the channel structure being connected to the common source line and the bit line.

2. The semiconductor memory device of claim 1, wherein the channel structure includes:
   a core insulating layer filling a central region of the hole; and a channel layer formed between the core insulating layer and the memory layer and extending onto one surface of the core insulating layer, which faces the bit line.

3. The semiconductor memory device of claim 2, wherein the channel layer includes:
   a first end portion protruding toward the bit line from the gate stack structure; and
   a second end portion protruding toward the common source line further than the memory layer, the second end portion being embedded into the common source line.

4. The semiconductor memory device of claim 3, wherein the first end portion is closed and tapering, and the second portion is open and widening.

5. The semiconductor memory device of claim 3, further comprising a bit contact plug disposed between the channel structure and the bit line.

6. The semiconductor memory device of claim 1, wherein the common source line includes:
   a doped semiconductor pattern overlapping with the gate stack structure, the doped semiconductor pattern including a conductivity-type dopant; and
   a metal pattern formed on a surface of the doped semiconductor pattern, the metal pattern being connected to the channel structure via the doped semiconductor pattern.

7. The semiconductor memory device of claim 1, further comprising:
   a dummy stack structure parallel to the gate stack structure; and
   a vertical contact plug disposed in the dummy stack structure, the vertical contact plug being formed of a same material layer as the common source line.

8. The semiconductor memory device of claim 7, further comprising:
   a substrate including a source line driving circuit overlapping with the gate stack structure and a page buffer circuit overlapping with the dummy stack structure;
   an insulating structure extending between the substrate, the vertical contact plug, and the common source line; and
   conductive connection structures connecting the source line driving circuit to the common source line, the conductive connection structures penetrating the insulating structure to connect the page buffer circuit to the vertical contact plug.

9. The semiconductor memory device of claim 7, wherein the bit line extends onto the dummy stack structure to be connected to the vertical contact plug.

\* \* \* \* \*